US009442156B2

(12) United States Patent
Ozawa et al.

(10) Patent No.: US 9,442,156 B2
(45) Date of Patent: Sep. 13, 2016

(54) ALIGNMENT SUPPORT DEVICE AND ALIGNMENT SUPPORT METHOD FOR PROBE DEVICE

(71) Applicant: Tokyo Seimitsu Co., Ltd., Hachioji-Shi, Tokyo (JP)

(72) Inventors: Yuichi Ozawa, Tokyo (JP); Hiroshi Nishimura, Tokyo (JP); Seiichi Ohta, Tokyo (JP); Yasuhito Iguchi, Tokyo (JP); Kunihiko Chiba, Tokyo (JP); Ken Kato, Tokyo (JP)

(73) Assignee: Tokyo Seimitsu Co., Ltd., Hachioji-Shi, Tokyo (JP)

( * ) Notice: Subject to any disclaimer, the term of this patent is extended or adjusted under 35 U.S.C. 154(b) by 0 days.

(21) Appl. No.: 14/833,568

(22) Filed: Aug. 24, 2015

(65) Prior Publication Data

US 2015/0362553 A1    Dec. 17, 2015

Related U.S. Application Data

(63) Continuation of application No. PCT/JP2014/053883, filed on Feb. 19, 2014.

(30) Foreign Application Priority Data

Feb. 27, 2013 (JP) ................. 2013-037154

(51) Int. Cl.
*G01R 31/00* (2006.01)
*G01R 31/28* (2006.01)
*G01R 1/04* (2006.01)

(52) U.S. Cl.
CPC ......... *G01R 31/2831* (2013.01); *G01R 1/0408* (2013.01)

(58) Field of Classification Search
CPC .......... G01R 31/2886; G01R 31/2887; G01R 31/2891; G01R 31/2831; G01R 31/2834; G01R 1/07314; G01R 1/06705; G01R 1/06794

See application file for complete search history.

(56) References Cited

U.S. PATENT DOCUMENTS 6,876,946 B2*  4/2005  Yasuda ................ G03F 9/7003
                                                    250/548
7,405,584 B2*  7/2008  Fujita ................. G01R 31/2891
                                                    324/750.19

(Continued)

FOREIGN PATENT DOCUMENTS

JP    2003-167032 A    6/2003
JP    2007-095938 A    4/2007

(Continued)

OTHER PUBLICATIONS

Mar. 25, 2014—International Search Report—Intl App PCT/JP2014/053883.

(Continued)

*Primary Examiner* — Son Le
*Assistant Examiner* — Thang Le
(74) *Attorney, Agent, or Firm* — Banner & Witcoff, Ltd.

(57) ABSTRACT

The present invention provides a probe device that includes an alignment utility function. When a user inputs a condition value for a variation amount (variation range) of a contact position at which a probe is in contact with each chip, in a simulation using actual measurement data acquired by measuring a position of each of all chips in one wafer, a range of variation of each chip is calculated by changing a measurement point at which alignment is performed to calculate a setting of optimum measurement points so that the range of variation is equal to or less than the condition value and the number of measurement points is minimum. Then information on the optimum measurement point is provided to the user.

14 Claims, 22 Drawing Sheets

(56) References Cited

U.S. PATENT DOCUMENTS

| | | | | |
|---|---|---|---|---|
| 7,969,172 | B2* | 6/2011 | Tanaka | G01R 31/2891 324/754.08 |
| 2007/0176612 | A1* | 8/2007 | Sakata | G01R 31/2891 324/750.16 |
| 2015/0192616 | A1* | 7/2015 | Chen | H01L 23/544 324/750.25 |

FOREIGN PATENT DOCUMENTS

| | | |
|---|---|---|
| JP | 2008-070308 A | 3/2008 |
| JP | 2008-164292 A | 7/2008 |
| JP | 2011-222851 A | 11/2011 |

OTHER PUBLICATIONS

Jan. 22, 2015—International Preliminary Report on Patentability—Intl App PCT/JP2014/053883.

Mar. 25, 2014—(WO) Written Opinion of ISA—Intl App PCTJP2014053883.

* cited by examiner

ALIGNMENT SUPPORT DEVICE AND ALIGNMENT SUPPORT METHOD FOR PROBE DEVICE

CROSS-REFERENCE TO RELATED APPLICATIONS

This application is a Continuation of PCT International Application No. PCT/JP2014/053883 filed on Feb. 19, 2014, which claims priority under 35 U.S.C. §119(a) to Japanese Patent Application No. 2013-037154 filed on Feb. 27, 2013. Each of the above application(s) is hereby expressly incorporated by reference, in its entirety, into the present application.

BACKGROUND OF THE INVENTION

1. Field of the Invention

The present invention relates to probe devices, and more particularly to probe devices for testing electrical characteristics of a semiconductor element (chip or die) such as a plurality of integrated circuits formed on a semiconductor wafer.

2. Description of the Related Art

In a semiconductor manufacturing process, a disk-like semiconductor wafer fixed to a dicing frame is cut into a plurality of chips (dies) by a dicing device in a dicing process. Before or after the dicing process, a wafer test process of inspecting electrical characteristics of each of the chips is performed, and a probe device is used in the wafer test process.

The probe device is used for allowing probes of a probe card which is connected to a tester to be brought into contact with electrode pads of chips. The probe device is configured to supply power and various test signals to each chip from the tester through the probe, and to allow the tester to acquire a response signal outputted from the electrode of each chip through the probe so that the response signal is analyzed to check whether each chip works normally (refer to Japanese Patent Application Laid-Open No. 2007-95938 (PTL1) and Japanese Patent Application Laid-Open No. 2011-222851 (PTL 2)). There is known a probe device among probe devices of this type, which is capable of fixing a wafer which is fixed to a dicing frame to a stage and performing a test on the wafer regardless of before or after dicing.

SUMMARY OF THE INVENTION

Since a wafer level chip size package (WLCSP) wafer and a chip size package (CSP) wafer have chips that are individually cut, there is a variation in an index size of each of the chips of the order of from a few μm to a few tens of μm.

Thus, in order to allow a probe to be accurately brought into contact with a pad in every chip in a wafer, it is preferable to perform alignment of each chip (die) as well as normal wafer alignment.

However, if alignment of every chip is performed, it takes an extremely long time (alignment time) until every alignment is finished. Thus, it is not realistic to perform alignment of each of all chips for every wafer to be inspected.

On the other hand, it is possible to shorten alignment time by limitedly performing alignment of some of chips of a wafer and estimating a position of the other chips from an actual measurement position of the chips for which alignment has been performed.

However, in particular, in a case where a wafer after dicing that is divided into individual chips is inspected, positions of respective chips varies. Thus, it is difficult to accurately estimate positions of chips, and if chips for which alignment is to be performed are limited too much, a state where a probe is not brought into contact with a pad in a chip may occur.

In a conventional probe device, when a user sets a control parameter related to alignment, there is a problem in which no information for allowing is provided to a user to determine to what extent it is possible to limit chips for which alignment is to be performed, or to determine to what extent it is possible to limit chips for which alignment is to be performed to shorten alignment time to desired time, whereby the user cannot easily determine them.

The present invention is made in light of the above-mentioned circumstances, and aims to provide an alignment support device and an alignment support method for a probe device, capable of providing useful information related to a setting of alignment when the probe device is operated.

In order to achieve the object described, an alignment support device in accordance with one aspect of the present invention is an alignment support device for a probe device which brings probes of a tester into contact with a plurality of chips formed on a wafer, the alignment support device comprising: an actual measurement data acquisition unit configured to acquire actual measurement data showing an actual measurement position of all the chips of the wafer; a condition value input unit configured to input a condition value related to a variation amount of a position at which each probe is in contact with each of the chips when the chips are brought into contact with the probes; a measurement point setting unit configured to set chips to which alignment is to be performed from among all the chips of the wafer, as measurement points; a shot position setting unit configured to set, as a shot position, positions of the probes with respect to the wafer when each of the chips of the wafer is brought into contact with the probe at an ideal contact position, and corrects the set shot position based on the actual measurement position of chips to be the measurement points set by the measurement point setting unit; a variation amount calculation unit configured to calculate the variation amount of a position of each of the chips of the wafer based on the actual measurement position of each of the chips when it is assumed that each of the chips of the wafer is brought into contact with the probe in accordance with the shot position after correction set by the shot position setting unit; a determination unit configured to determine whether the variation amount of the position of each of the chips calculated by the variation amount calculation unit is equal to or less than the condition value inputted by the condition value input unit or not; a measurement point changing unit configured to sequentially change a setting of the measurement points performed by the measurement point setting unit to a different setting; an optimum measurement point determination unit configured to determine a setting of measurement points, in which the variation amount of each of the chips calculated by the variation amount calculation unit is equal to or less than the condition value and a number of the measurement points is minimum, as an optimum measurement point setting, from among the settings of the measurement points sequentially changed by the measurement point changing unit; and an output unit configured to output information related to the optimum measurement point setting determined by the optimum measurement point determination unit.

According to the aspect, it is possible to provide information related to a setting of measurement points for performing alignment so that the variation amount of a position at which each probe is in contact with each of chips of a wafer is equal to or less than a condition value to a user, and then the user can set an appropriate control parameter related to alignment with reference to the information when operating a probe device.

In an alignment support device for a probe device in accordance with another aspect of the present invention, it is preferable that the measurement point changing unit changes settings of the measurement points so that an interval between the measurement points sequentially increases, and the optimum measurement point determination unit determines a setting of measurement points at a time just before when the variation amount of a position in any one of all the chips of the wafer exceeds the condition value, as the optimum measurement point setting.

In an alignment support device for a probe device in accordance with yet another aspect of the present invention, it is preferable that the measurement point changing unit performs: a first changing processing of changing settings of the measurement points so that an interval between the measurement points sequentially increases; and a second changing processing of changing settings of the measurement points so that the interval between the measurement points sequentially decreases, and the optimum measurement point determination unit repeatedly performs: an individual calculation range setting processing of changing a setting of measurement points other than a determined range in which a setting of measurement points is determined by performing the first changing processing, and setting a partial range including a chip in which the variation amount of exceeds the condition value as an individual calculation range, when the variation amount of in any one of all the chips of the wafer exceeds the condition value; and an individual calculation processing of changing settings of measurement points in the individual calculation range by performing the second changing processing, determining a setting of measurements point when the variation amount in each of all chips in the individual calculation range becomes equal to or less than the condition value, as an optimum measurement point setting in the individual calculation range, and setting the individual calculation range as the determined range, and repeats the individual calculation range setting processing and the individual calculation processing until all the chips of the wafer become chips within the determined range.

An alignment support device in accordance with one aspect of the present invention is an alignment support device for a probe device which brings probes of a tester into contact with a plurality of chips formed on a wafer, the alignment support device comprising: a condition value input unit configured to input a condition value related to alignment time showing time required to alignment for measuring a position of each of chips of the wafer is finished; a measurement point setting unit configured to set chips for which alignment is to be performed from among all the chips of the wafer, as measurement points; an alignment time calculation unit configured to calculate an alignment time required when it is assumed that alignment is performed for the chips which are set as the measurement points by the measurement point setting unit; a determination unit configured to determine whether the alignment time calculated by the alignment time calculation unit is equal to or less than the condition value inputted by the condition value input unit; a measurement point changing unit configured to sequentially change a setting of the measurement points performed by the measurement point setting unit to a different setting; an optimum measurement point determination unit configured to determine a setting of measurement points, in which the alignment time calculated by the alignment time calculation unit is equal to or less than the condition value, and a number of the measurement points is maximum, as an optimum measurement point setting, from among settings of the measurement points sequentially changed by the measurement point changing unit; and an output unit configured to output information related to the optimum measurement point setting determined by the optimum measurement point determination unit.

According to the aspect, it is possible to provide information related to a setting of measurement points for performing alignment so that alignment time is equal to or less than a condition value to a user, and then the user can set an appropriate control parameter related to alignment with reference to the information when operating a probe device.

In an alignment support device for a probe device in accordance with another aspect of the present invention, it is preferable that the measurement point changing unit changes settings of the measurement points so that an interval between the measurement points sequentially increases, and the optimum measurement point determination unit determines a setting of measurement points when the alignment time becomes equal to or less than the condition value, as an optimum measurement point setting.

In an alignment support device for a probe device in accordance with yet another aspect of the present invention, it is preferable that the output unit outputs the number of measurement points and an interval between the measurement points in the setting of measurement points determined by the optimum measurement point determination unit.

An alignment support method for a probe device in accordance with one aspect of the present invention is alignment support method for a probe device which brings probes of a tester into contact with a plurality of chips formed on a wafer, the alignment support method comprising: an actual measurement data acquisition step of acquiring actual measurement data showing an actual measurement position of each of all chips of the wafer; a condition value inputting step of inputting a condition value related to a variation amount of a position at which each probe is in contact with each of the chips when the chips are brought into contact with the probes; a measurement point setting step of setting, as measurement points, chips to which alignment is to be performed from among all the chips of the wafer; a shot position setting step of setting, as a shot position, positions of the probes with respect to the wafer when each of the chips of the wafer is brought into contact with the probe at an ideal contact position, and corrects the set shot position based on the actual measurement position of chips to be the measurement points set by the measurement point setting step; a variation amount calculation step of calculating the variation amount of the position of each of the chips of the wafer based on the actual measurement position of each of the chips when it is assumed that each of the chips of the wafer is brought into contact with the probe in accordance with the shot position after correction set by the shot position setting step; a determination step of determining whether the variation amount of the position of each of the chips calculated by the variation amount calculation step is equal to or less than the condition value inputted by the condition value inputting step, or not; a measurement point changing step of sequentially changing a setting of the measurement points by the measurement point setting step, to a different setting; an optimum measurement point determination step of determining a setting of measurement points, in which the variation amount of each of the chips calculated by the variation amount calculation step is equal to or less than the condition value and a number of the measurement points is minimum, as an optimum measurement point setting, from among the settings of the measurement points sequentially changed by the measurement point changing step; and an outputting step of outputting information related to the optimum measurement point setting determined by the optimum measurement point determination step.

According to the aspect, it is possible to provide information related to a setting of measurement points for performing alignment so that the variation amount of a position at which each probe is in contact with each of chips of a wafer is equal to or less than a condition value to a user, and then the user can set an appropriate control parameter related to alignment with reference to the information when operating a probe device.

An alignment support method for a probe device in accordance with one aspect of the present invention is an alignment support method for a probe device which brings probes of a tester into contact with a plurality of chips formed on a wafer, the alignment support method comprising: a condition value inputting step of inputting a condition value related to alignment time showing time required to alignment for measuring a position of each of chips of the wafer is finished; a measurement point setting step of setting chips for which alignment is to be performed from among all the chips of the wafer, as measurement points; an alignment time calculation step of calculating the alignment time required when it is assumed that alignment is performed for the chips set as the measurement points by the measurement point setting step; a determination step of determining whether an alignment time calculated by the alignment time calculation step is equal to or less than the condition value inputted by the condition value inputting step; a measurement point changing step of sequentially changing a setting of the measurement points set by the measurement point setting step, to a different setting; an optimum measurement point determination step of determining a setting of measurement points, in which the alignment time calculated by the alignment time calculation step is equal to or less than the condition value, and a number of the measurement points is maximum, as an optimum measurement point setting, from among the settings of the measurement points sequentially changed by the measurement point changing step; and an outputting step of outputting information related to the optimum measurement point setting determined by the optimum measurement point determination step.

According to the aspect, it is possible to provide information related to a setting of measurement points for performing alignment so that alignment time is equal to or less than a condition value to a user, and then the user can set an appropriate control parameter related to alignment with reference to the information when operating a probe device.

According to the present invention, it is possible to provide useful information related to a setting of alignment at the time when a probe device is operated.

DETAILED DESCRIPTION OF THE EMBODIMENTS

Hereinafter, referring to accompanying drawings, a preferable embodiment of the present invention will be described in detail.

Figure 1:
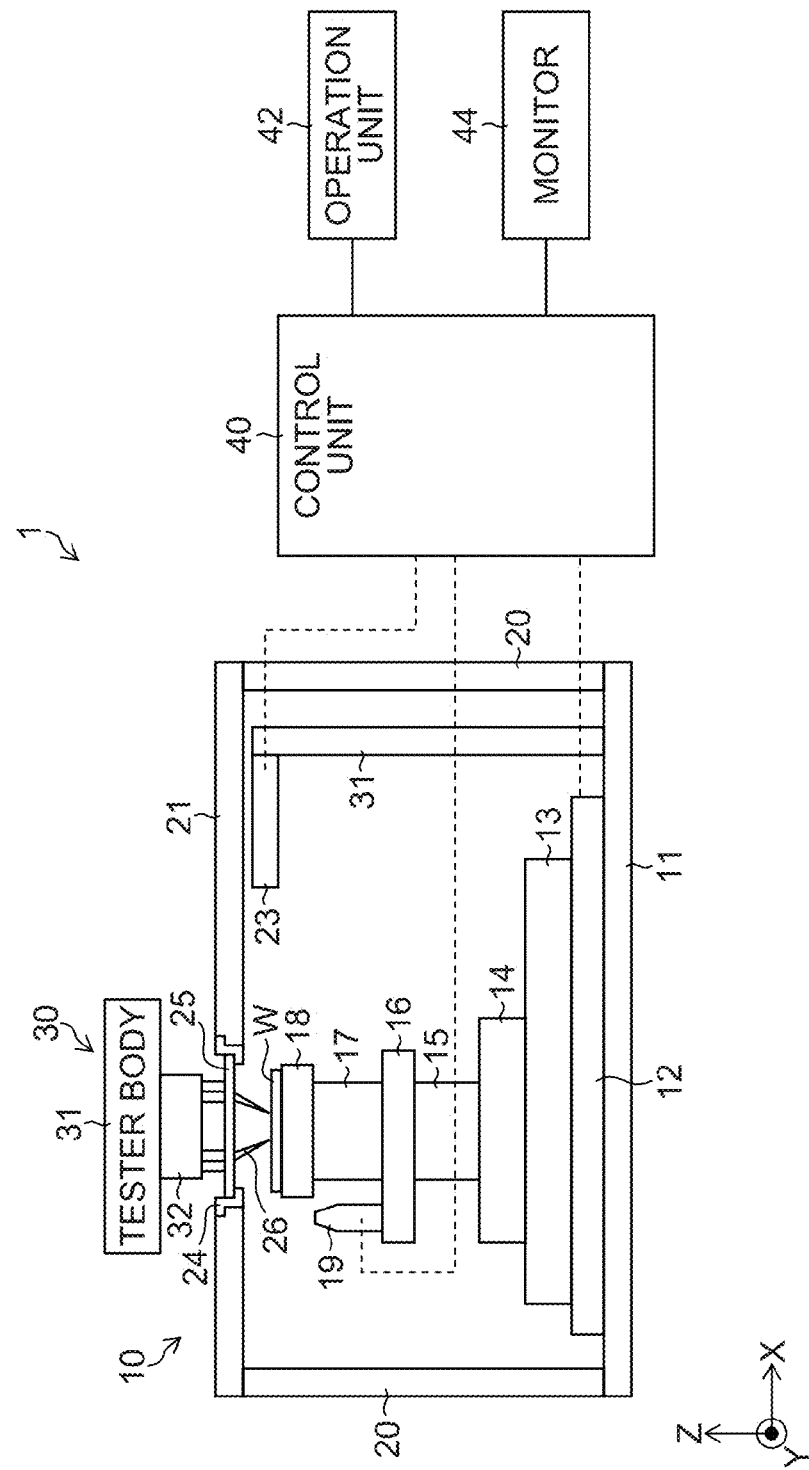
FIG. 1 shows a schematic configuration of a wafer test system to which the present invention is applied.

FIG. 1 shows a schematic configuration of a wafer test system to which the present invention is applied. A wafer test system 1 includes a prober (probe device) 10, and a tester 30. A wafer W to be inspected, on which a large number of semiconductor chips (hereinafter simply referred to as chips) are formed, is positioned by the prober 10 to be electrically connected to the tester 30 through a probe card 25. The tester 30 provides a test signal for each of the chips of the wafer W through a large number of probes 26 arranged in the probe card 25, and a response signal in response to the test signal outputted from the wafer W is measured by the tester 30. Accordingly, performance of each of the chips is inspected (measurement of electrical characteristics) so that quality determination (sorting of a non-defective and a defective) and the like of each of the chips is performed on the basis of a measurement result of the response signal in response to the test signal.

In the present wafer test system 1, the wafer W having been divided into individual chips (dies) by a dicing device (not shown) can be tested in a state where the wafer is attached to a dicing frame. In addition, even a wafer before being divided into chips, instead of the wafer having been divided into individual chips after dicing, can also be tested. Moreover, even a wafer that is not fixed to the dicing frame can also be tested.

The prober 10 includes: a stage movement mechanism that moves a wafer stage 18 supporting the wafer W to be inspected to a predetermined position; a probe position detection camera 19 that photographs the probes 26 arranged in the probe card 25; a wafer alignment camera 23 that photographs the wafer W; a probe card support mechanism that supports the probe card 25; a control unit 40 that performs control of each component of the prober 10, and various kinds of calculation processing including image processing; and the like.

The control unit 40 is arranged inside or outside a body of the prober 10, for example, and operation of each component of the prober 10 is integrally controlled by a signal from the control unit 40.

Since the control unit 40 is connected to an operation unit 42 (such as a keyboard, a mouse, a touch panel, and an operation button), and a monitor 44, an operator can provide an instruction related to control of the prober 10 and a setting of various conditions (parameters) to the control unit 40 by operating the operation unit 42 with reference to a guide screen or the like displayed in the monitor 44.

In addition, since the control unit 40 is also connected to the tester 30 (a tester body 31 described later) through communication means in a communicative manner, for example, various instructions to the tester 30, acquisition of a measurement result from the tester 30, and the like, can be performed by the control unit 40.

Hereinafter, control contents and the like by the control unit 40 will be appropriately described.

The stage movement mechanism is composed of a base 11, a movable base 12, a Y-axis movable base 13, an X-axis movable base 14, a Z-axis moving unit 15, a Z-axis movable base 16, a θ rotating unit 17, a wafer stage 18, and the like.

The base 11 is formed in a plate-like shape and is arranged in a bottom of the prober 10, so that the entire prober 10 is supported by the base 11. The movable base 12 is arranged on an upper face of the base 11.

The movable base 12 is fixed to the base 11, and the Y-axis movable base 13 is arranged on the movable base 12.

The Y-axis movable base 13 is supported by the movable base 12 so as to be movable in a Y-axis direction, and is moved in the Y-axis direction by power of a motor (not shown). The Y-axis direction is parallel to an installation face (the upper face of the base 11), and shows a fore-and-aft direction (back-and-forth direction) of the prober 10. That is, the Y-axis direction shows a direction perpendicular to a paper-surface of FIG. 1. The X-axis movable base 14 is arranged on the Y-axis movable base 13.

The X-axis movable base 14 is supported by the Y-axis movable base 13 so as to be movable in an X-axis direction, and is moved in the X-axis direction by power of a motor (not shown). The X-axis direction is orthogonal to the Y-axis as well as parallel to the installation face, and shows a side-to-side direction (right-and-left direction) of the prober 10. That is, the X-axis direction shows a side-to-side direction of the paper-surface of FIG. 1. The Z-axis moving unit 15 is arranged on the X-axis movable base 14.

The Z-axis moving unit 15 is fixed to the X-axis movable base 14, and the Z-axis movable base 16 is supported above the Z-axis moving unit 15. The Z-axis moving unit 15 is provided with a mechanism of moving the Z-axis movable base 16 in a Z-axis direction by power of a motor (not shown). The Z-axis is orthogonal to the X-axis and the Y-axis as well as perpendicular to the installation face, and shows a vertical direction of the prober 10. That is, the Z-axis shows a vertical direction (up-and-down direction) of the paper-surface of FIG. 1. The θ rotating unit 17 is arranged on the Z-axis movable base 16.

The θ rotating unit 17 is supported with respect to the Z-axis movable base 16 so as to be rotatable around the Z-axis (a θ direction), and is rotated in the θ direction by power of a motor (not shown) to rotate the wafer stage 18 fixed on the θ rotating unit 17 in the θ direction.

The wafer stage 18 is provided on its upper face side with a flat table surface on which the wafer W to be inspected is to be mounted, and the wafer W is to be sucked and held on the table. A plurality of wafers of the same kind as the wafer W to be inspected are accommodated in a cassette (not shown), and a wafer to be inspected is to be sequentially taken out of the cassette by feeding means (not shown) to be fed to the table face of the wafer stage 18.

In accordance with the stage movement mechanism, the wafer stage 18 is supported on the base 11 through the Y-axis movable base 13, the X-axis movable base 14, the Z-axis movable base 16, and the θ rotating unit 17, and is to be moved in three axial directions of the X-axis, the Y-axis, and the Z-axis, and the θ direction (around the Z-axis) as the bases and the unit are moved. Accordingly, the wafer W mounted on the wafer stage 18 is also to be moved in the three axial directions and the θ direction together with the wafer stage 18.

Each of motors of the stage movement mechanism is driven by a control signal from the control unit 40, a position of each of the Y-axis movable base 13, the X-axis movable base 14, the Z-axis movable base 16, and the θ rotating unit 17 is to be detected by a sensor to be provided to the control unit 40.

Thus, the control unit 40 is configured to control a position of each of the Y-axis movable base 13, the X-axis movable base 14, the Z-axis movable base 16, and the θ rotating unit 17 so that the wafer stage 18, and the wafer W held on the wafer stage 18 can be moved to a desired position.

For example, at the time of an inspection by the tester 30, the control unit 40, as described later, allows the wafer stage 18 to be rotated by the θ rotating unit 17 so that an array direction of electrode pads of each of the chips aligns with an array direction of the probes 26 on the basis of a position of each of probes 26 detected and a position of each of chips of the wafer W. After the electrode pads of each of the chips to be inspected are moved so as to be positioned below the probes 26, the wafer stage 18 is raised to allow the electrode pads to be brought into contact with the probes 26.

In this manner, the electrode pads of each of the chips of the wafer W is sequentially moved to a position at which the electrode pads are brought into contact with the probes 26 to allow the tester 30 described later to inspect each of the chips.

The configuration of the stage movement mechanism described above is an example, so that there is available any mechanism capable of supporting the wafer W to be inspected on the wafer stage to move the wafer W to a predetermined position.

The probe position detection camera 19 is fixed on the Z-axis movable base 16 described above by setting its photographing field upward, and is configured to be moved in the three axial directions of the X-axis, the Y-axis, and the Z-axis by control of the control unit 40, as with the wafer stage 18.

In addition, the probe position detection camera 19 is connected to the control unit 40, and the control unit 40 is configured to control photographing operation of the probe position detection camera 19 as well as capture an image photographed by the probe position detection camera 19.

Accordingly, the control unit 40 allows the probe position detection camera 19 to be moved to a position below the probe card 25 to take an image of the probes 26 arranged in the probe card 25, and captures the image. Then, a tip position of each of the probes 26 is detected from the image, and the tip position of each of the probes 26 detected is detected as a position of each of the probes 26.

For example, it is possible to acquire a position (XY-coordinate) of a tip of each of the probes 26 in a horizontal direction (the X-axis direction and the Y-axis direction) on the basis of the position of the probe position detection camera 19 in the horizontal direction at the time of photographing and the detected position of the tip of each of the probes 26 in the image, and it is possible to acquire a position (Z-coordinate) of the tip of each of the probes 26 in a vertical direction (the Z-axis direction) on the basis of a focus position of the probe position detection camera 19.

The detection of a probe position described above is performed every time when the probe card 25 is replaced in accordance with a kind of the wafer W to be inspected, or is performed at regular intervals after the probe card 25 is replaced.

Here, the probe card 25 is normally provided with several thousands of probes 26 or more. Instead of acquiring the positions of all probes 26 using images of all probes taken by the probe position detection camera 19, it is also possible to acquire positions of only specific probes 26 using images of the specific probes 26 taken by the probe position detection camera 19. In this case, the positions of other probes can be acquired with reference to information about arrangement of each of the probes in the probe card 25 (such as design data).

The wafer alignment camera 23 is supported by a support column 20 fixed to the base 11 by setting its photographing field downward.

In addition, the wafer alignment camera 23 is connected to the control unit 40, and the control unit 40 is configured to control the wafer alignment camera 23 as well as capture an image photographed by the wafer alignment camera 23.

Accordingly, the control unit 40 allows the wafer W supported by the wafer stage 18 to be moved to a position below the wafer alignment camera 23 to take an image of the wafer W, and captures the image. Then a position of each of the electrode pads of the respective chips of the wafer W is detected from the image, and a position of each of the chips is detected on the basis of a detected position of each of the electrode pads.

For example, it is possible to acquire a position (X-coordinate and Y-coordinate) of each of the chips in the horizontal direction (the X-axis direction and the Y-axis direction) on the basis of a position of the wafer stage 18 in the horizontal direction at the time of photographing and the detected position of each of the electrode pads of the respective chips in the image.

Here, a coordinate of a position of a specific electrode pad of each of the chips may be acquired as a position of each of the chips. Or, a coordinate of a predetermined position to be reference such as a center of each of the chips may be acquired as a position of each of the chips.

Further, instead of acquiring positions of all the chips of the wafer W by using images of all the chips taken by the wafer alignment camera 23, it is also possible to acquire positions of only specific chips are acquired by using images of the specific chips taken by the wafer alignment camera 23. In this case, the positions of other chips can be acquired with reference to information related to arrangement of each of the chips in the wafer W (such as design data).

The probe card support mechanism includes a head stage 21, a card holder 24, and the like.

The head stage 21 is supported by support columns 20 and the like which are supported by the base 11 and is arranged in an upper portion of the prober 10. The head stage 21 is formed in a plate-like shape, and is provided with an opening in a part of thereof. The card holder 24 is fixed in the opening, and the card holder 24 is configured so that the probe card 25 can be attached to the card holder 24 in a detachable manner.

Accordingly, the probe card 25 is held in the upper portion of the prober 10.

The probe card 25 is replaced in accordance with a device to be inspected (a kind of the wafer W), and is provided with a large number of probes 26 arranged in accordance with arrangement of electrodes of a device to be inspected. A tip of each of the probes 26 is to be brought into contact with one of the electrode pads of the respective chips of the wafer W held in the wafer stage 18.

In addition, the probe card 25 is provided with terminals which are connected to the respective probes 26, and the respective probes 26 are to be electrically connected to the tester 30 through the terminals.

Further, there are two kinds of the probe card 25: a single probing card that is provided with the number of probes required to inspect one chip; and a multiple probing card that is provided with the number of probes required to inspect a plurality of chips, and that simultaneously inspects the plurality of chips by one contact operation between the wafer W and the probes, and both of them are usable in the present system.

The tester 30 includes a tester body 31, and a contact ring 32.

The tester body 31 is supported in the upper portion of the prober 10 by a support mechanism (not shown). The tester body 31 is provided inside with: a circuit that generates and outputs a test signal that is to be applied to each of chips of the wafer W to be inspected; a circuit that receives (captures) a response signal outputted from each of the chips in response to the test signal; a processing unit that inspects performance of each of the chips (measures electrical characteristics) on the basis of a state of the response signal in response to the test signal to perform quality determination (sorting of a non-defective and a defective) and the like of each of the chips; and the like.

The tester body 31 is provided in its bottom with the contact ring 32, and the contact ring 32 is arranged above the probe card 25.

The contact ring 32 is provided with a large number of contactors connected to the circuits inside the tester body 31, and the contactors are in contact with respective terminals connected to the respective probes 26 of the probe card 25.

Accordingly, the circuits inside the tester body 31 are electrically connected to the respective probes 26 of the probe card 25 through the contact ring 32.

As a result, a test signal is applied to a chip with which the probe 26 is in contact from the tester body 31 through the probe 26, and a response signal outputted from the chip in response to the test signal is to be taken in the tester body 31 through the probe 26. Then, the tester body 31 is configured to inspect performance of the chip on the basis of the response signal to perform quality determination and the like of the chip.

In addition, since the tester body 31 is connected to the control unit 40 through communication means in a communicative manner, various instructions to the tester 30, acquisition of an inspection result from the tester 30, and the like, can be performed by the control unit 40.

Accordingly, when an electrode pad of each of chips of the wafer W supported by the wafer stage 18 is brought into contact with the probe 26 at the time of inspection, for example, the control unit 40 notifies the tester body 31 of completion of inspection preparation so that the tester body 31 performs the inspection of performance of each of the chips. When the tester body 31 notifies the control unit 40 of completion of the inspection, the control unit 40 performs position control of the wafer W to allow the probes 26 to be brought into contact with chips to be inspected next.

In addition, the tester body 31 sends an inspection result of each of the chips to the control unit 40, and the inspection result is displayed in the monitor 44 and is used as information for marking and the like to a defective chip.

Next, an alignment utility function provided in the control unit 40 described above will be described.

The control unit 40 includes a processor (central processing unit(CPU)) that performs calculation and control, a storage device (memory) that temporarily or permanently stores data, an input-output device (input/output (I/O)) that interchanges a signal with the outside, and the like, as with general computers. The control unit 40 is connected to motors and sensors of the stage movement mechanism of the prober 10, the probe position detection camera 19, the wafer alignment camera 23, the tester body 31 of the tester 30, the operation unit 42, the monitor 44, and the like, through the I/O.

The CPU performs various kinds of processing in accordance with a program stored in the memory to appropriately perform the following: position control of the wafer W (wafer stage 18); control of photographing operation of the probe position detection camera 19 and the wafer alignment camera 23; capture of images photographed by the cameras; capture of an operation signal in response to operation of the operation unit 42; output of a display image to a screen of the monitor 44; and the like, as described above.

As one of functions provided in the control unit 40 by performing processing of the CPU in accordance with a program, there is provided an alignment utility function of assisting a user in setting a control parameter of alignment control of measuring a position of each of chips of the wafer W to be inspected (position of an electrode pad) by using the wafer alignment camera 23.

The alignment utility mainly assists in setting the control parameter of the alignment control to shorten time period of alignment control (alignment time period), because if a position of every chip of the wafer W is measured (actual measurement), the alignment control requires a long time.

Although details will be described later, for example, when a user specifies the variation amount (variation range) of a contact position (probe contact position) of each probe 26 with respect to each chip, and alignment conditions about alignment time period, for example, the alignment utility calculate a setting of control parameters for the alignment control which can reduce the number of chips to which alignment (measurement of a position) is performed as much as possible within a range satisfying the alignment conditions by simulation, and provides the user with that result.

The user can set the control parameters for the alignment control that is to be actually performed, with reference to the information on the setting above.

When using the alignment utility function, the user instructs execution of the alignment utility by performing a predetermined operation in the operation unit 42. Accordingly, a screen of the alignment utility is displayed in a screen of the monitor 44. Then, in the screen, the user can operate the operation unit 42 to select a desired function from among various functions included in the alignment utility function so that processing as described below can be performed.

Figure 2:
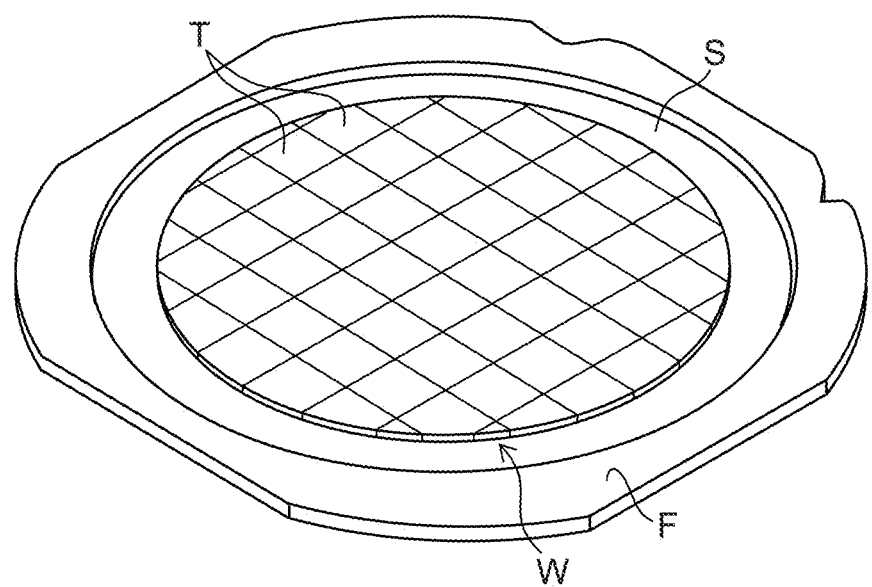
FIG. 2 shows a wafer to be inspected.

In description of the present embodiment, it is assumed that the wafer W to be inspected is a wafer W after dicing, that is, the wafer W (a wafer fixed to a dicing frame) which is adhered to a dicing sheet S, mounted on a ring-shaped frame F and diced by a dicing device into individual chips "T"s, as shown in FIG. 2.

In addition, the probe card 25 is a card for multiple probing including probes, as the probes 26, that are simultaneously brought into contact with two-by-two chips, for example.

First, there is described a case where execution of a variation range displaying function is selected after the alignment utility is performed.

The variation range displaying function is a function for displaying a variation range of a contact position of each of probes with respect to each of chips of the wafer W to be inspected.

Figure 3:
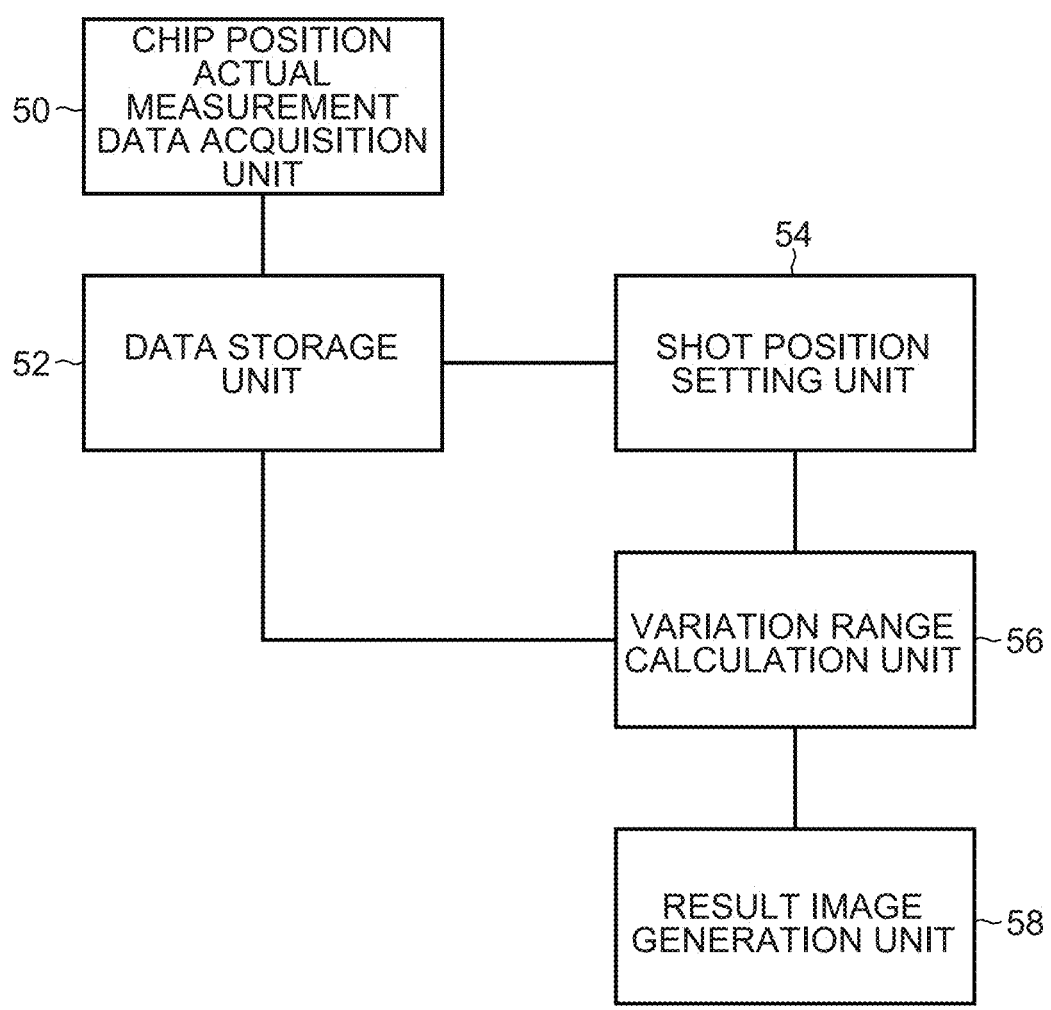
FIG. 3 is a block diagram showing processing units in a control unit, configured by processing of a CPU in accordance with a program of performing a variation range displaying function.

FIG. 3 is a block diagram showing processing units in the control unit 40, configured by execution of a program for performing the variation range displaying function by the CPU.

In FIG. 3, when inspecting a large number of the wafers W to be inspected shown in FIG. 2, a chip position actual measurement data acquisition unit (actual measurement data acquisition means) 50 mounts one of the wafers W on the wafer stage 18 as a sample wafer and performs alignment of all chips by the alignment control.

Here, in the alignment control performed by the control unit 40, for example, the wafer W mounted on the wafer stage 18 is moved to below the wafer alignment camera 23 and photographed. When it is assumed that array directions of vertical and horizontal chips of the wafer W are indicated as an X-axis direction and a Y-axis direction, respectively, the wafer W is moved in the θ direction (rotated) so that those axial directions align with the X-axis direction and the Y-axis direction in a space of the prober 10, respectively.

If a row of chips arranged in the X-axis direction in the wafer W is indicated as a line, the chips on the wafer W form a plurality of lines in the Y-axis direction at predetermined intervals.

Subsequently, the wafer W moves in the X-axis direction by the predetermined interval (an interval between centers of adjacent chips in the X-axis direction) on the basis of an index size in the X-axis direction corresponding to a size of each of the chips of the wafer W in the X-axis direction, and the wafer alignment camera 23 photographs an image of a chip for every predetermined number of chips, among a plurality of the chips in the same line, as a measurement point to which alignment is applied.

A position of an electrode pad of the chip of the measurement point is measured on the basis of the photographed image as a position of the chip.

When this kind of line alignment along a line in the X-axis direction is performed for one line, the wafer W moves in the Y-axis direction by a predetermined interval (an interval between centers of adjacent chips in the Y-axis direction) on the basis of an index size in the Y-axis direction corresponding to a size of each of the chips of the wafer W in the Y-axis direction so that alignment is performed for chips along a line for every predetermined number of lines, among a plurality of lines.

The chip position actual measurement data acquisition unit 50 performs the alignment control such as described above for the sample wafer, and measures a position of every chip in the wafer W by setting a movement interval of the wafer W in the X-axis direction at the time of line alignment of each of lines as an index size in the X-axis direction, and setting a movement interval of the wafer W in the Y-axis direction at the time of changing a line for which the line alignment is to be performed as an index size in the Y-axis direction.

Accordingly, a position of every chip of the sample wafer is acquired as actual measurement data (actual measurement data on chip positions), and the actual measurement data on chip positions is stored in a data storage unit 52.

Here, the wafer W to be inspected in the present embodiment is the wafer W after dicing which has been divided into individual chips, and is fixed to the dicing frame as described in FIG. 2. In this kind of wafer W after dicing, distortion occurs in a position of each of the chips (arrangement of the chips) as compared with arrangement of the chips before the dicing, and there is a certain tendency in the way of the distortion.

Thus, the actual measurement data on chip positions acquired by the chip position actual measurement data acquisition unit 50 can be considered to be data that shows a position of each of chips of the same kind of wafer W after dicing which has been divided into individual chips as with the sample wafer, or of each of chips of all the wafers W to be inspected.

The data storage unit 52 stores the actual measurement data on chip positions acquired by the chip position actual measurement data acquisition unit 50, as well as stores data required for the calculation below, such as design data related to arrangement of the chips of the wafer W to be inspected before dicing, and design data related to arrangement of the probes 26 of the probe card 25 that corresponds to a kind of the wafer W to be inspected, and that is provided in the card holder 24 of the prober 10.

A storage medium storing data as the data storage unit 52 is not limited to a storage medium built in the control unit 40, and there are available a storage medium attached to the control unit 40 in a detachable manner, and a storage medium of another device (such as a computer) connected to the control unit 40 in a communicative manner. In addition, the data storage unit 52 may include a plurality of the storage media described above, and is not limited to a storage medium arranged at a specific place if a storage medium is in a state where data can be acquired in the control unit 40 (CPU).

A shot position setting unit 54 sets a shot position at the time of probe contact control of allowing the probes 26 of the probe card 25 to be brought into contact with an electrode pad of each of chips of the wafer W at the time of inspection by the tester 30.

Here, in the probe contact control performed by the control unit 40, for example, the wafer W to be inspected mounted on the wafer stage 18 is moved below the probes 26 in the X-axis direction and the Y-axis direction in order to position a target chip in the X-axis and Y-axis directions so that an electrode pad of the target chip is to be brought into contact with the probe 26.

Then, the wafer W is raised from that position (moved in the Z-axis direction) and the electrode pad of the target chip is brought into contact with the probe 26 so that the tester 30 performs inspection for the target chip. When the inspection ends, the wafer W is lowered (moved in the Z-axis direction) and the target chip is separated from the probe 26.

This control is repeatedly performed while a chip to be a target is changed so that all chips of the wafer W are inspected.

In this kind of probe contact control, a shot position indicates a position on the wafer W, at which the probe 26 of the probe card 25 is brought into contact with the wafer W.

The probe card 25 is normally provided with a plurality of probes 26 that is simultaneously brought into contact with a respective plurality of electrode pads, and the shot position indicates a position at which each of the probes 26 is brought into contact with the wafer W.

In a case where a multiple-probing card is used as the probe card 25 like the present embodiment, one shot position is set to determine a range of chips with which the respective probes 26 are simultaneously brought into contact.

In the probe contact control, the shot position is set at a plurality of different positions in the X-axis and Y-axis directions with respect to the wafer W so that all chips of the wafer W are brought into contact with the respective probes 26 and each of the probes 26 is not simultaneously brought into contact with the same chip.

The shot position setting unit 54 sets such the shot position. In addition, when setting the shot position, the shot position setting unit 54 refers to the following data stored in the data storage unit 52: the design data related to arrangement (positions) of chips of the wafer W before dicing (the same kind of wafer W as that to be inspected); the actual measurement data on chip positions described above; the design data related to arrangement (positions of respective probes) of the probes 26 of the probe card 25; and the like.

A variation range calculation unit (variation amount calculation means) 56 calculates a variation range (a displacement amount, a variation amount) of a position (a probe contact position) at which each probe 26 is brought into contact with each of chips of the wafer W to be inspected based on each of shot positions set by the shot position setting unit 54, the actual measurement data on chip positions stored in the data storage unit 52 and so on, by assuming that the probe contact control is performed in accordance with the shot positions set by the shot position setting unit 54.

The variation range (displacement amount) is a value indicating a size and direction of a displacement of a probe contact position in each of chips from an ideal contact position, and also can be indicated as a size of the displacement in each of the X-axis direction and the Y-axis direction.

For example, in a case where arrangement (position) of each of chips of the wafer W before dicing, and arrangement (position) of each of the probes 26 of the probe card 25 for multiple probing corresponding to a kind of the wafer W, are identical with design data, it is possible to set a shot position for the wafer W before dicing so that each probe 26 is brought into contact with an ideal contact position (such as a center position of each of electrode pads) of each of the chips. In that case, a variation range (displacement amount) in each of the chips can be indicated as 0 (zero).

On the other hand, if it is assumed that the probe contact control is performed for the wafer W after dicing being an inspection target inspected with the same setting of a shot position as that of the wafer W before dicing, because a position of each of chips of the wafer W after dicing is displaced from a position of each of chips of the wafer W before dicing (position of design data), a position at which each probe 26 is brought into contact with each of the chips also displaces from the ideal contact position. As a result, the variation range (displacement amount) becomes a value different from 0.

A result image generation unit (image generation means) 58 generates a result image (described later) for visually displaying a result of a variation range calculated by the variation range calculation unit 56 so that the monitor 44 displays the result image in its screen.

A processing content and a processing procedure of each of the processing units 50 to 58 in the variation range displaying function will be described with reference to the flow chart of FIG. 4.

Figure 4:
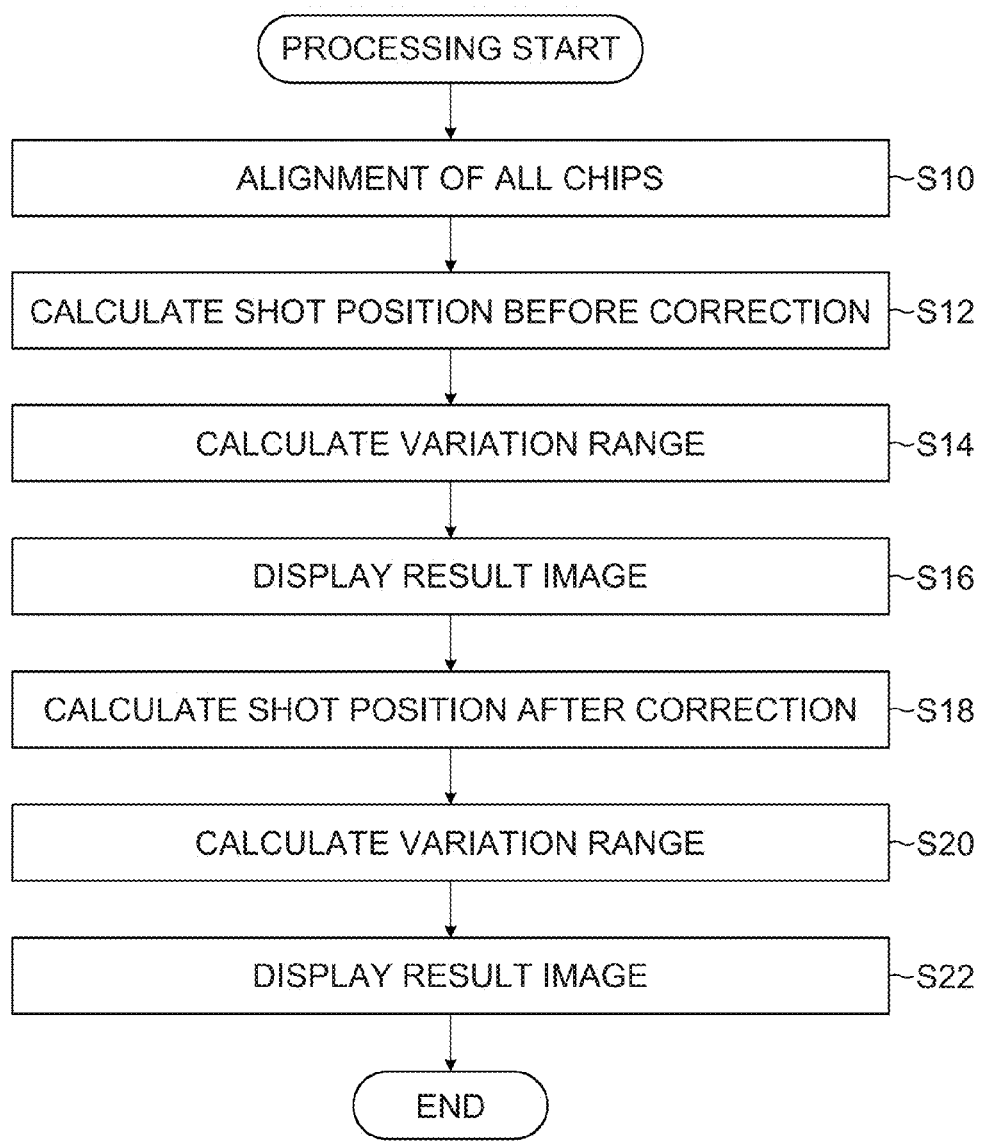
FIG. 4 is a flow chart showing a processing procedure in the variation range displaying function.

When an operator selects the variation range displaying function in a screen of alignment utility by operating the operation unit 42, processing according to the flow chart of FIG. 4 starts.

First, as processing in step S10, the chip position actual measurement data acquisition unit 50 mounts one of a large number of the wafers W to be inspected on the wafer stage 18 as a sample wafer to perform alignment (alignment of all chips) for every chip (die) by using the wafer alignment camera 23.

Accordingly, a position of every chip of the sample wafer W is measured (actual measurement), and a position of each of the chips that is actually measured is stored in the data storage unit 52 as actual measurement data on chip positions.

Since the processing in step S10 is required to be performed for the sample wafer W to be inspected only once, it is unnecessary to perform the processing in step S10 if actual measurement data on chip positions of the wafer W to be inspected has already been stored in the data storage unit 52.

Next, as processing in step S12, the shot position setting unit 54 loads the design data related to arrangement (position) of chips of wafer W before dicing, which is the same kind of the wafer W to be inspected, and the design data related to arrangement (position) of the probes 26 of the probe card 25, from the data storage unit 52.

Then, there is set a shot position for allowing the probe 26 to be brought into contact with an ideal contact position for each of chips of the wafer W before dicing at the time of the probe contact control. The shot position provided here is indicated as a shot position before correction in distinction from a shot position after correction described later.

Next, as processing in step S14, the variation range calculation unit 56 loads the actual measurement data on chip positions of the wafer W to be inspected, and the design data related to arrangement (position) of the probes 26 of the probe card 25, from the data storage unit 52. Then, on the basis of the data above, for the wafer W to be inspected, there is calculated a variation range (displacement amount) of a position at which each probe 26 of the probe card 25 is brought into contact with each of chips arranged in the actual measurement position, from the ideal contact position, in a case where each probe 26 is brought into contact with the shot position before correction set in step S12, (in a case where the probe contact control is performed in accordance with the shot position before correction set by the shot position setting unit 54).

Subsequently, as processing in step S16, the result image generation unit 58 generates a result image for visually displaying the variation range of each of the chips calculated in step S14 so that the monitor 44 displays the result image in its screen as a display image of the variation range.

Figure 5:
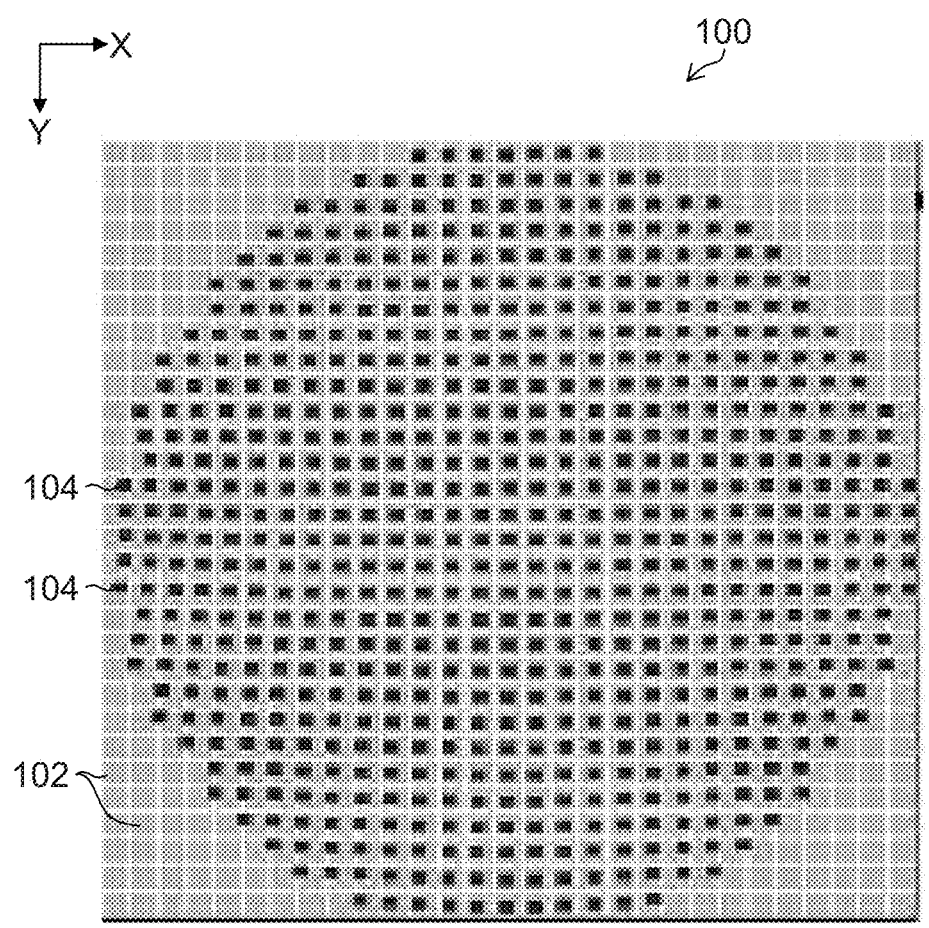
FIG. 5 shows a variation range display image.

FIG. 5 shows a variation range display image.

In FIG. 5, in a variation range display image 100 (hereinafter simply referred to as a display image 100), there is formed a large number of quadrangular areas 102 each of which is enclosed by lines arranged at equal intervals in a lateral direction and longitudinal direction, and the quadrangular areas 102 are arranged and displayed in the lateral direction and longitudinal direction at equal intervals.

Each of the quadrangular areas 102 shows an area of one chip, and respective chips of the wafer W to be inspected corresponds to the respective quadrangular areas 102 of the display image 100 in accordance with arrangement of the chips in the wafer W.

The quadrangular areas 102 include an area that does not correspond to any chip of the wafer W.

If the lateral direction is indicated as an X-axis direction, and the longitudinal direction is indicated as a Y-axis direction in the display image 100 (in a screen), chips arranged in a line in the X-axis direction in the wafer W correspond to respective quadrangular areas 102 arranged in a line in the X-axis direction also in the display image 100. Moreover, chips arranged in a line in the Y-axis direction in the wafer W correspond to respective quadrangular areas 102 arranged in a line in the Y-axis direction also in the display image 100.

In the display image 100, there is displayed a large number of quadrangular dots 104 corresponding to the respective quadrangular areas 102 each of which corresponds to each of chips of the wafer W, and each of the dots 104 shows a variation range (displacement amount) of a probe contact position of each of the chips from the ideal contact position.

That is, the result image generation unit 58 displays each of the dots 104 in a position displaced from a center position of each of the quadrangular areas 102, by a displacement length (displacement size) from the center position corresponding to the size of the variation range (displacement amount) of a chip corresponding to each of the quadrangular areas 102, in a direction displaced from the center position corresponding to the direction of the variation range thereof, on the basis of the variation range (displacement amount) calculated by the variation range calculation unit 56 for each of the chips.

Figure 6:
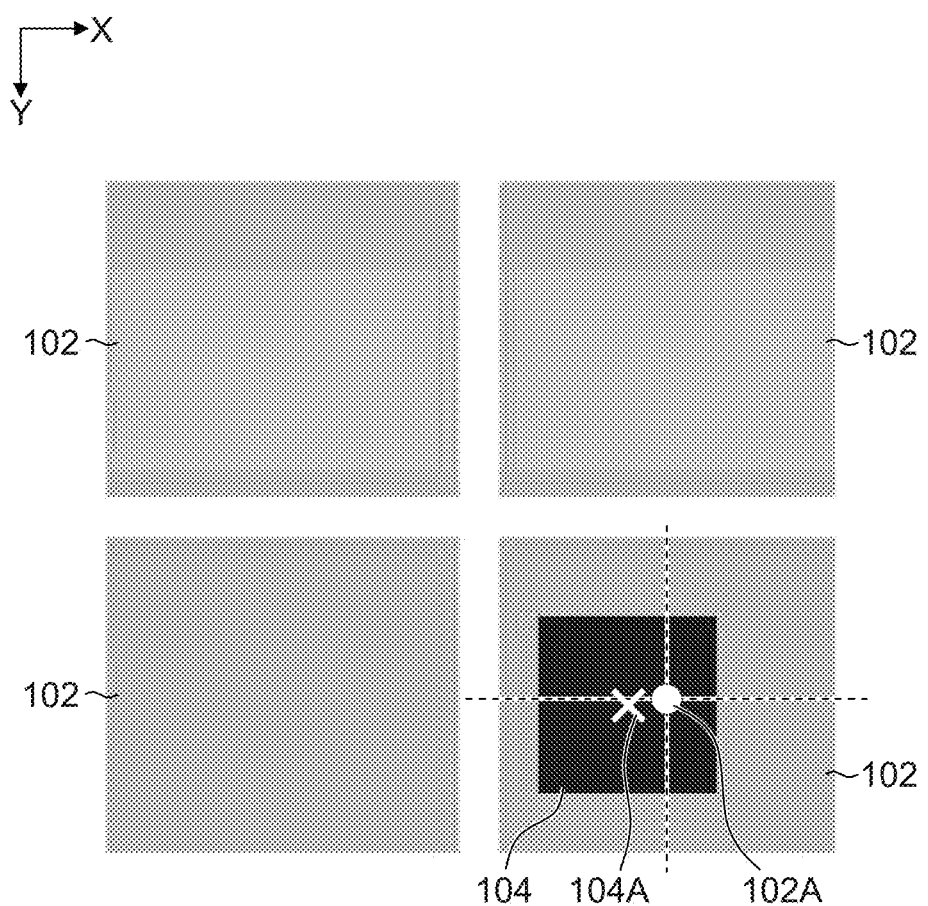
FIG. 6 shows an enlarged view of a part of FIG. 5.

FIG. 6 shows four quadrangular areas 102 extracted from the display image 100 of FIG. 5, in which the dot 104 is displayed in the quadrangular area 102 in the lower right.

In FIG. 6, a center 104A of the dot 104 is displayed at a position shifted (displaced) from a center 102A of the quadrangular area 102. At this time, a size of displacement from the center 102A of the quadrangular area 102 to the center 104A of the dot 104 indicates a size of a variation range (a size of displacement of a probe contact position from the ideal contact position), and a direction of the center 104A of the dot 104 with respect to the center 102A of the quadrangular areas 102 indicates a direction of the variation range (a direction of displacement of the probe contact position from the ideal contact position). That is, the displacement amount from the center 102A of the quadrangular areas 102 to the center 104A of the dot 104 in each of the X-axis and Y-axis directions is in proportion to the displacement amount of the probe contact position from the ideal contact position in each of the X-axis and Y-axis directions, respectively.

Display of such the display image 100 enables a user to visually grasp a variation range of a position at which the probe 26 is brought into contact with each of the chips of the wafer W.

Each of the dots 104 shown in FIG. 5 may be displayed by changing at least one of brightness, hue, chroma, in accordance with a size of the variation range.

Although, in the display image 100, a difference between a probe contact position based on an actual measurement position of each of the chips and the ideal contact position is indicated as a variation range, a difference between an actual measurement position (a position shown by the actual measurement data on chip positions) of each of the chips of the wafer W to be inspected and a position of each of the chips of the wafer W before dicing (an ideal position shown by design data related to arrangement of chips of the wafer W) may be displayed as the variation range, as with the display image 100.

In this case, it is possible to calculate the variation range of each of the chips on the basis of the actual measurement data on chip positions acquired in step S10 and design data related to arrangement (position) of the chips of the wafer W before dicing.

Returning to the flow chart of FIG. 4, after the processing in step S16, for example, if a user instructs correction of the shot position by operating the operation unit 42, as processing in step S18, the shot position setting unit 54 loads the actual measurement data on chip positions of the wafer W to be inspected from the data storage unit 52.

Then, the shot position before correction set in step S12 is corrected so that a shot position capable of allowing each probe 26 to be optimally brought into contact with the actual measurement position of each of the chips is set as a shot position after correction.

Here, in the present embodiment, the probe card 25 is a card for multiple probing, and the probes 26 provided in the probe card 25 for a plurality of chips are simultaneously brought into contact with the respective plurality of chips of the wafer W.

Accordingly, it is impossible to correct the shot position so that probe contact positions of all the chips with which the respective probes 26 are simultaneously brought into contact coincide with the ideal contact positions.

Thus, a displacement position at which an average value of a size of a variation range of each of the chips with which the respective probes 26 are simultaneously brought into contact becomes minimum is detected, for each of the shot positions before correction of the respective plurality of chips, and the detected position is set as a shot position after correction.

Figure 7:
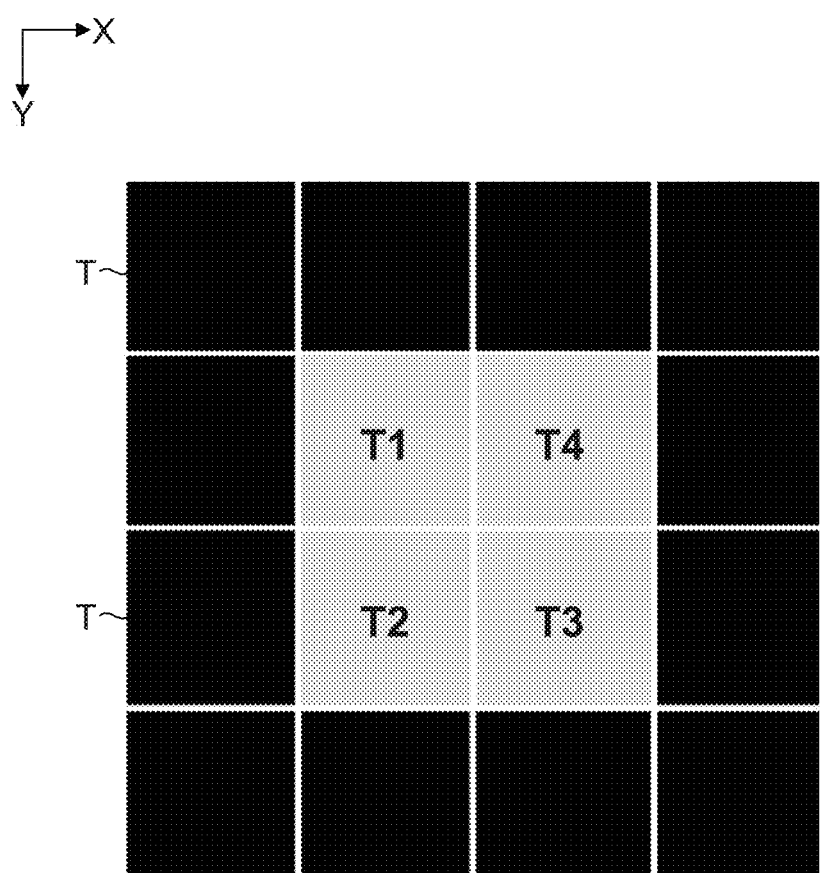
FIG. 7 shows an example of chips with which probes of a probe card are simultaneously brought into contact.

FIG. 7 shows chips with which the respective probes 26 of the probe card 25 are simultaneously brought into contact by one shot position, and for example, the respective probes 26 are simultaneously brought into contact with four chips T1 to T4 of two by two chips adjacent to each other in the X-axis direction and Y-axis direction among chips "T"s arranged in the wafer W.

Figure 8A:
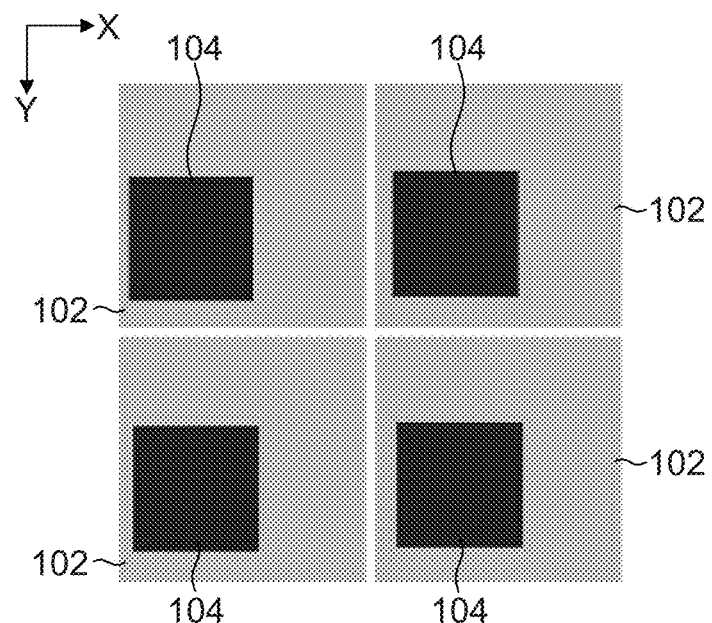
FIG. 8A is a diagram used to describe correction of a shot position.

On the other hand, FIG. 8A shows the quadrangular areas 102 by extracting a part of the display image 100 of a variation range before correction of a shot position shown in FIG. 5, and shows quadrangular areas 102 corresponding to four chips with which the respective probes 26 of the probe card 25 of FIG. 7 are simultaneously brought into contact at respective predetermined shot positions.

As shown in a display position of each of the dots 104 of FIG. 8A, before correction of a shot position, each of positions at which the respective probes 26 are brought into contact with chips corresponding to respective quadrangular areas 102 is displaced from the ideal contact position in a lower-left direction.

Figure 8B:
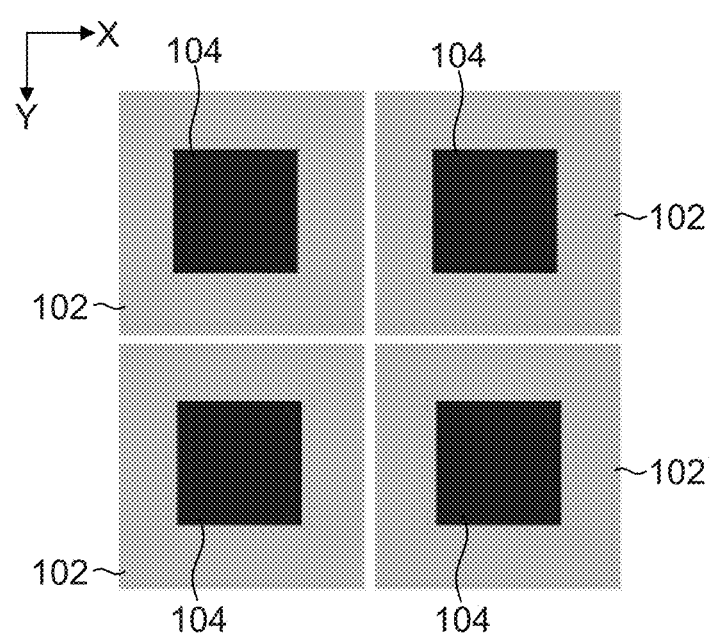
FIG. 8B is a diagram used to describe correction of a shot position.

Thus, if the shot position is displaced in a upper-right direction to be shifted in the X-axis direction and Y-axis direction with respect to each of the chips so that the shot position is corrected to a position at which a total of a size of a variation range of each the chips becomes minimum, it is possible to allow a position at which the probe 26 is brought into contact with each of the chips to be close to the ideal contact position. Then, if a variation range of each of the chips at the time is displayed like FIG. 8A, each of the dots 104 is displayed at an approximate center of each of the quadrangular areas 102, as shown in FIG. 8B.

Returning to FIG. 4, when setting of the shot position after correction in step S18 ends, as processing in step S20, the variation range calculation unit 56, as with the processing in step S14, calculates a variation range (displacement amount) of a probe contact position of each of the chips for the wafer W to be inspected in a case where the probe 26 is brought into contact with the chip at the shot position after correction set in step S18.

Then, as processing in step S22, the result image generation unit 58 generates a result image for visually displaying the variation range of each of the chips calculated in step S20, and then the result image is displayed in a screen of the monitor 44 as a display image of the variation range after correction of a shot position.

Figure 9:
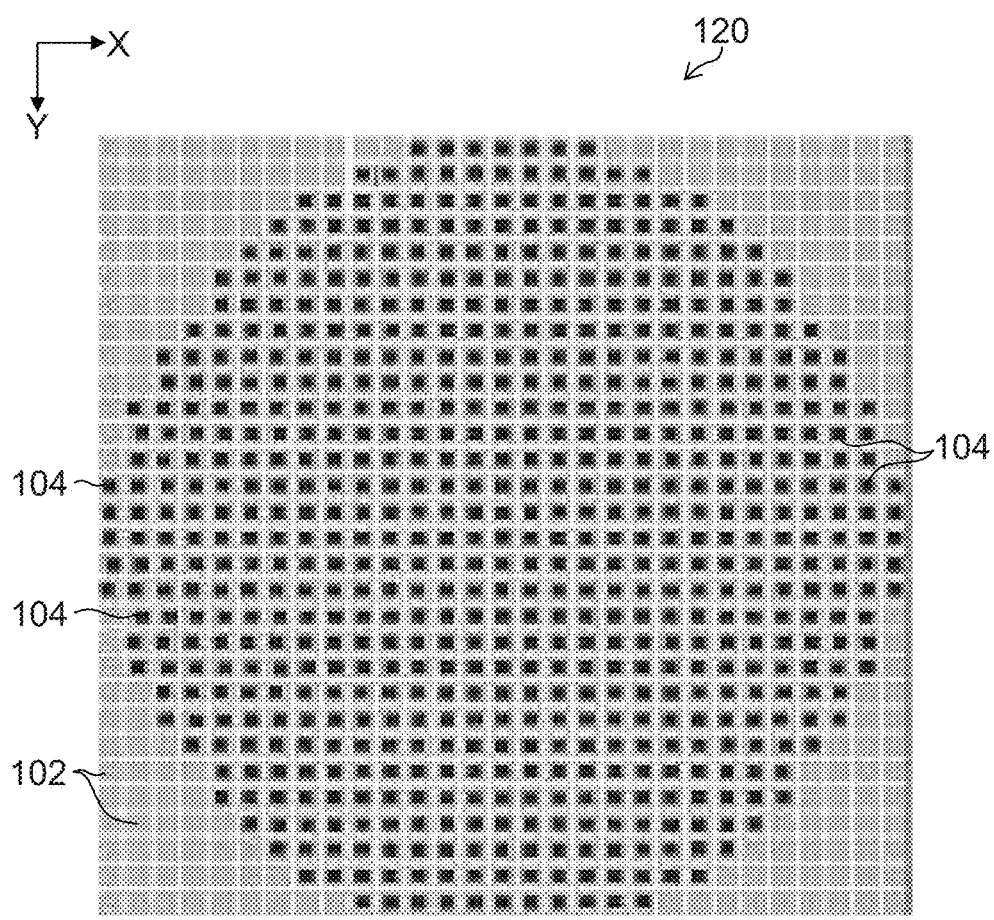
FIG. 9 shows a variation range display image after shot position correction.

FIG. 9 shows the display image of the variation range after correction of a shot position.

A display image of the variation range after correction of a shot position 120 (hereinafter simply referred to as the display image 120) shown in FIG. 9 is composed as with the display image of the variation range 100 before correction of a shot position shown in FIG. 5.

Comparing the display image 120 after correction of a shot position of FIG. 9 and the display image 100 before correction of a shot position of FIG. 5, each of the dots 104 is displayed around the center of the quadrangular areas 102 in the display image 120 of FIG. 9, so that it is perceived that a position at which the probe 26 is brought into contact with each of the chips becomes close to the ideal contact position by correcting the shot position.

A user can display the display image 100 before correction of a shot position of FIG. 5 and the display image 120 after correction of a shot position of FIG. 9, which are generated as described above, in a screen of the monitor 44 by switching them or in parallel by performing predetermined operation in the operation unit 42. The user can visually grasp to what extent the variation range of the probe contact position of each of the chips is improved by the correction of a shot position by comparing them.

The variation range display image formed by the result image generation unit 58 is not limited to the forms shown in FIGS. 5 and 9, and forms described below are available. Then, a user may select display in any of those different forms by operating the operation unit 42.

Figure 10:
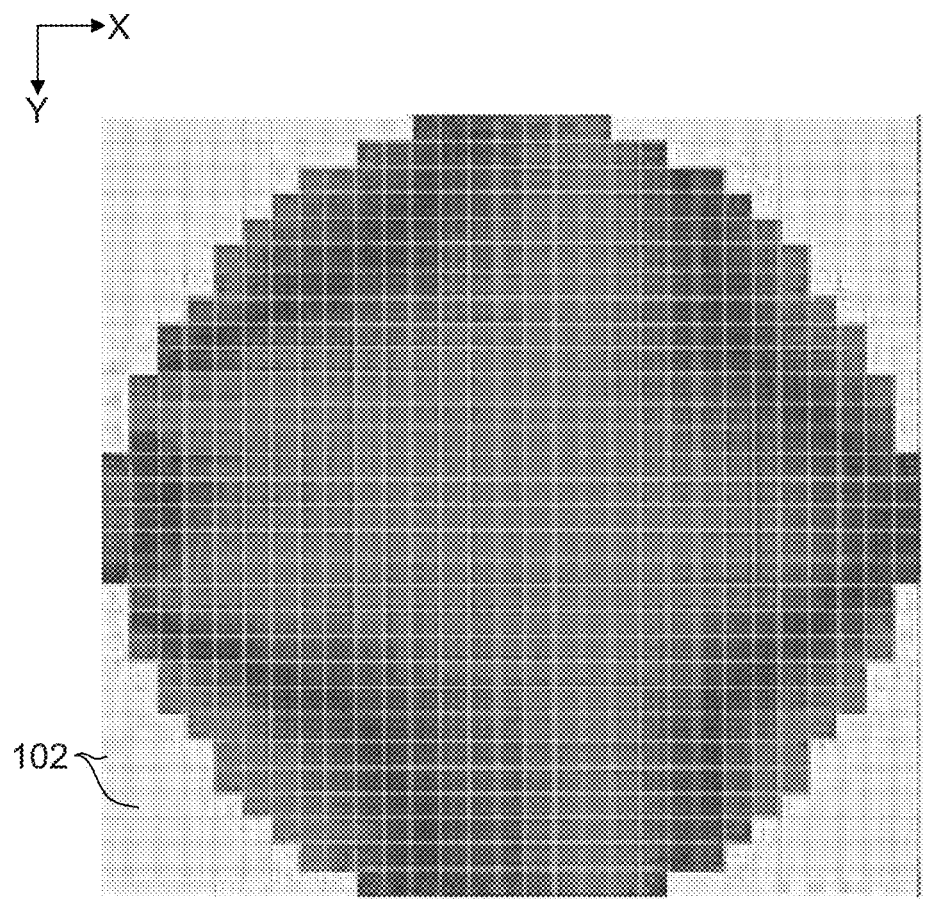
FIG. 10 shows a variation range display image according to another embodiment.

FIG. 10 shows a form in which the inside of each of the quadrangular areas 102 similar to those of FIGS. 5 and 9 is filled in with a predetermined color, and any one of brightness, chroma, and hue, of the color is changed in accordance with a size of a variation range (displacement amount) of each of the chips.

Figure 11:
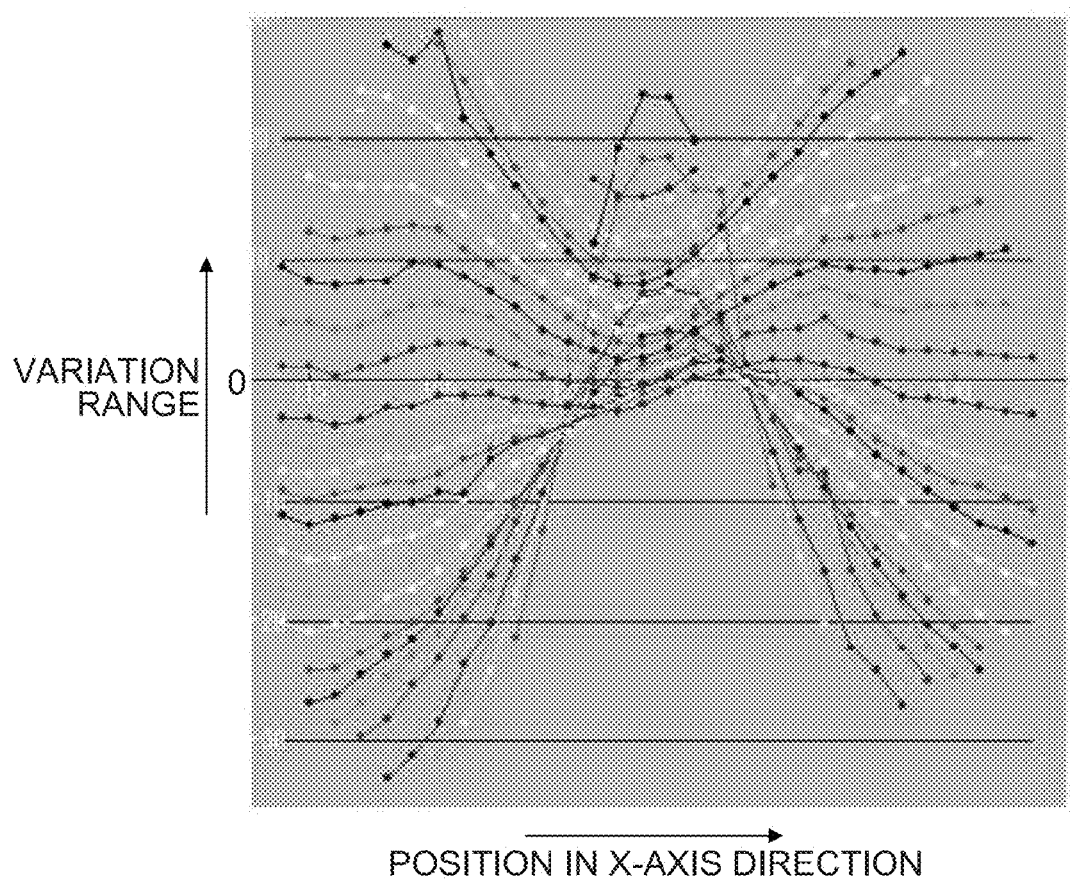
FIG. 11 shows a variation range display image according to another embodiment, which is a variation range display image before the shot position correction.
Figure 12:
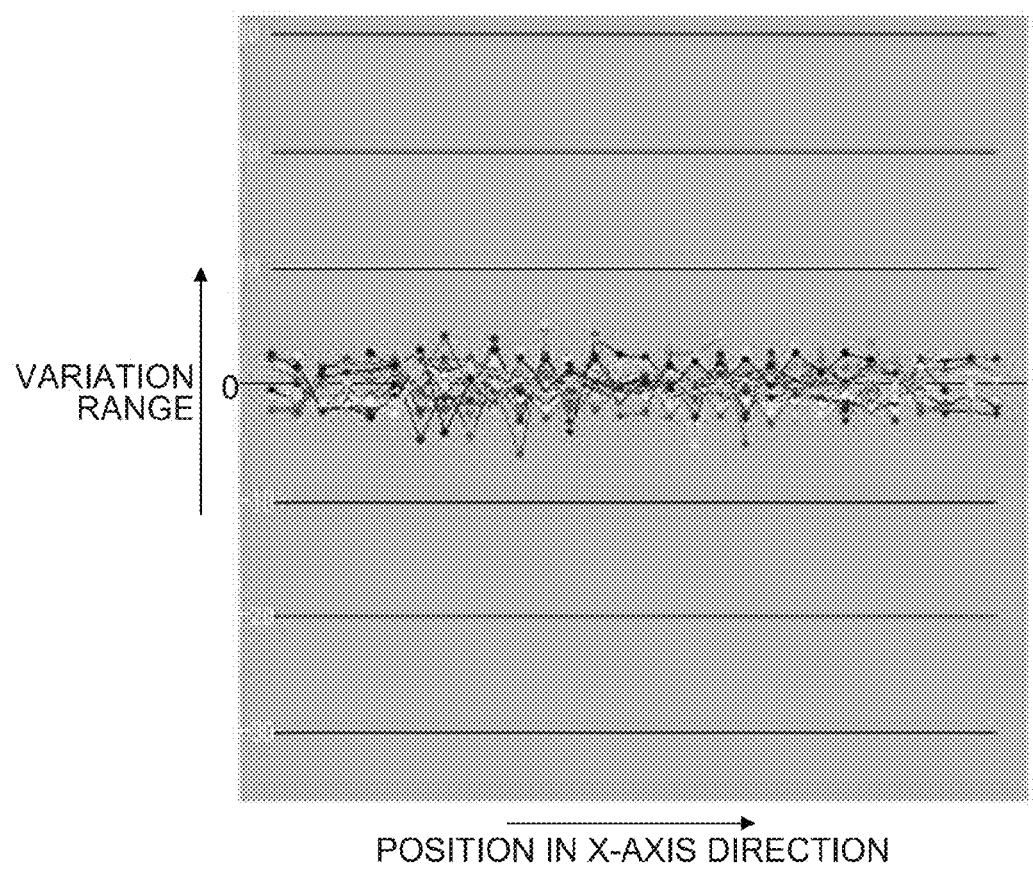
FIG. 12 shows an image in a case where a variation range display image after the shot position correction is displayed according to the same embodiment as that of FIG. 11.

FIG. 11 is a form in which a dot showing a size of a variation range of each of chips in the same line in the X-axis direction is connected by a straight line for every line in the X-axis direction of chips of the wafer W to form a graph display. In FIG. 11, a horizontal axis of the graph shows a position of each of the chips in the X-axis direction, and a vertical axis shows a size of each of ranges of variation in the X-axis direction. FIG. 11 shows by example a variation range display image before correction of a shot position, and for reference, FIG. 12 shows a variation range display image after correction of a shot position displayed by the same form as that of FIG. 11. In addition, a size of a variation range in the Y-axis direction also can be displayed as with FIGS. 11 and 12.

Next, there is described a case where an automatic measurement point calculation function is selected to be performed after the alignment utility is performed.

The automatic measurement point calculation function is a function of automatically setting a measurement position (measurement point) at which alignment is performed at the time of alignment control so that an alignment condition based on a condition value specified by a user is satisfied, and providing a result of the setting for the user.

Here, each measurement point shows a chip for which alignment (measurement of a position) is performed among a large number of chips arranged.

In addition, it is possible to select a mode of a different kind of alignment condition as a kind (mode) of automatic measurement point calculation function. The kinds of the alignment condition include an alignment condition related to a variation range, and an alignment condition related to alignment time.

The alignment condition related to a variation range is a condition in which the alignment control is performed so that a variation range of a probe contact position of each of the chips becomes equal to or less than a condition value specified by a user at the time of the probe contact control. Modes adopting the condition of this kind further include, a mode adopting a condition in which measurement points are selected so as to be uniform as a whole, and a mode adopting a condition in which measurement points are partially increased or reduced, as a kind of alignment condition related to selection of measurement points. The former mode is referred to as a first mode, and the latter mode is referred to as a second mode.

The alignment condition related to alignment time is a condition in which the alignment control is performed so that alignment time required for the alignment control (time required to finish measurement of positions of all respective chips for which alignment is performed) becomes equal to or less than a condition value specified by a user, and a mode adopting the condition of this kind is referred to as a third mode.

After the alignment utility is performed, the user can select a desired mode from among the first to third modes of the automatic measurement point calculation function to perform the mode, and hereinafter, the first to third modes of the automatic measurement point calculation function will be described in order.

First, the automatic measurement point calculation function of the first mode will be described.

Figure 13:
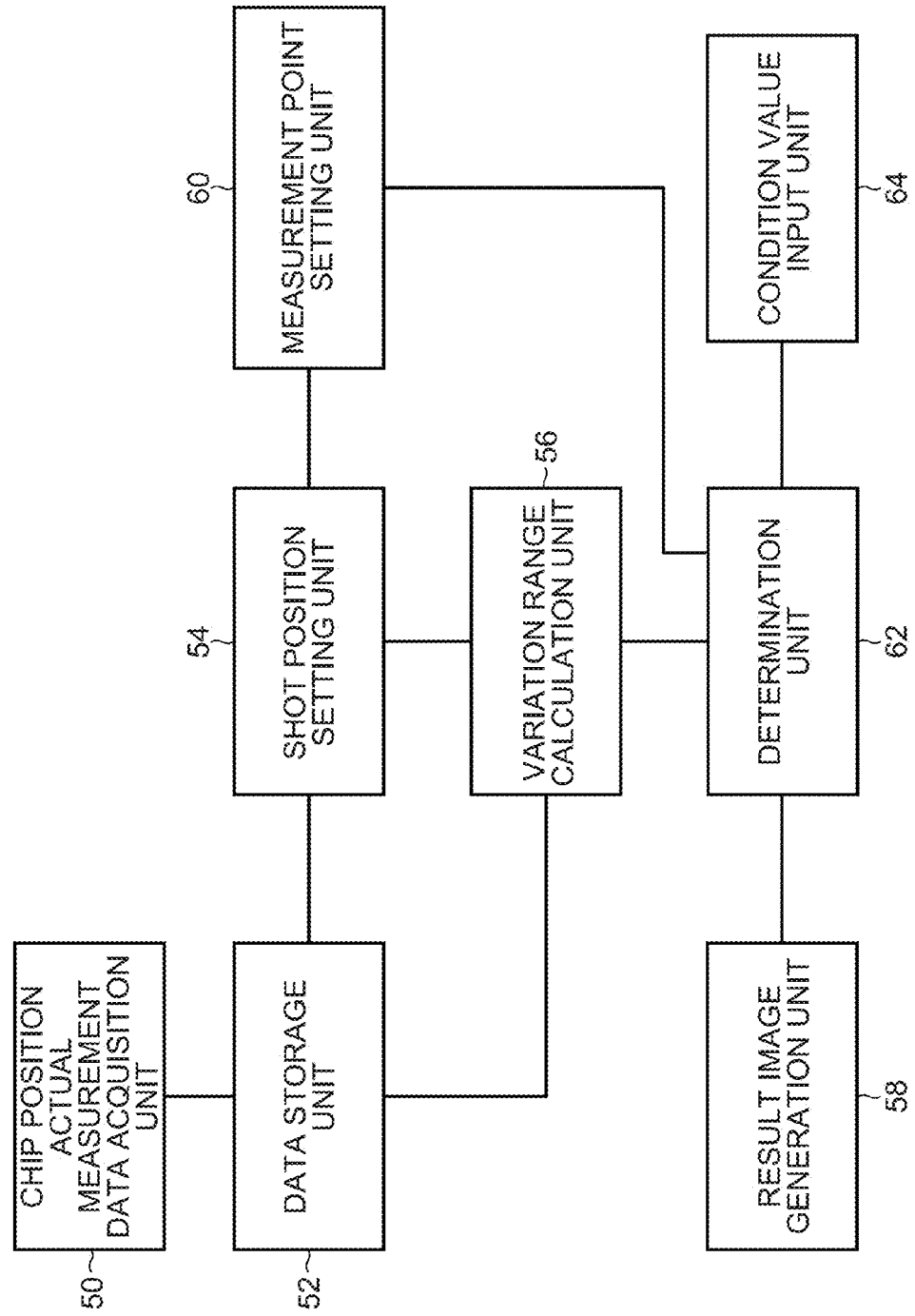
FIG. 13 is a block diagram showing processing units in a control unit, configured by executing using a CPU a program of performing a first mode of an automatic measurement point calculation function.

FIG. 13 is a block diagram showing processing units configured in the control unit 40 by executing using a CPU a program of performing the first mode of the automatic measurement point calculation function.

FIG. 13 shows the chip position actual measurement data acquisition unit 50, the data storage unit 52, the shot position setting unit 54, the variation range calculation unit 56, and the result image generation unit 58, each of which performs processing similar to that of the processing unit designated by the same reference numeral described in FIG. 3. As compared with FIG. 3, there are added a measurement point setting unit (measurement point setting means, measurement point changing means) 60, a determination unit (determination means) 62, and a condition value input unit (condition value input means) 64. Since processing contents of the chip position actual measurement data acquisition unit 50 and the data storage unit 52 are exactly identical with the processing contents described in FIG. 3, description thereof is omitted.

The measurement point setting unit 60 sets chips to be targets for which alignment (actual measurement of a chip position (XY-coordinate)) is performed, as measurement points.

Figure 14:
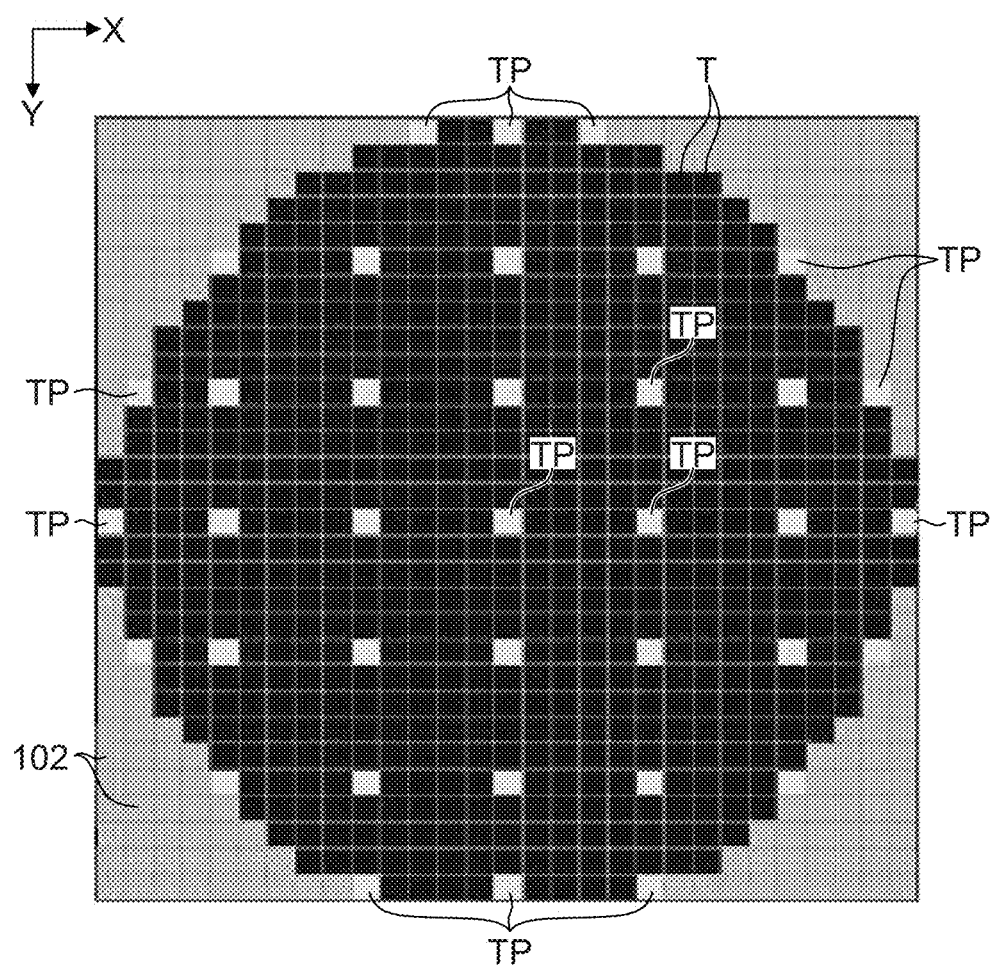
FIG. 14 shows by example a state of setting measurement points by using a chart in which each of chips of a wafer W is shown by a quadrangular area as with FIG. 5.

Here, FIG. 14 shows by example a state of setting measurement points by using a chart in which each of the chips of the wafer W is shown by the quadrangular area 102 as with FIG. 5. In FIG. 14, each part of chips set as a measurement point (corresponding quadrangular area) is designated by a reference character TP. As a chip at a measurement point, the following chips are selected from among chips T in the wafer W: a chip at the center; and chips arranged at an interval (measurement interval in the X-axis direction) of every predetermined number of chips in the X-axis direction as well as at an interval (measurement interval in the Y-axis direction) of every predetermined number of chips (the number of lines) in the Y-axis direction, with respect to the chip at the center.

That is, there are selected the following lines as a measurement line from among a plurality of lines of the chips of the wafer W along the X-axis direction: a line to be the center in the Y-axis direction; and lines arranged at an interval of every predetermined number of chips (lines) in the Y-axis direction (a measurement interval in the Y-axis direction) with respect to the line to be the center in the Y-axis direction. As a chip at a measurement point, the following chips are selected from among chips arranged in each line of the measurement lines: a chip to be the center in the X-axis direction; and chips apart from the chip at the center at an interval of every predetermined number of chips (measurement interval in the X-axis direction). The example of FIG. 14 shows a state where a measurement interval in each of the X-axis direction and the Y-axis direction is set at 4 chips.

In addition, even if whatever value is set for the measurement interval, a line at each of an uppermost end and a lowermost end is always selected as a measurement line. Moreover, a chip at each of right and left ends of chips in each of the lines is always selected as a chip at a measurement point.

The number of chips indicating the measurement interval in the X-axis direction and the number of chips (the number of lines) indicating the measurement interval in the Y-axis direction are to be specified by the determination unit 62, and the measurement point setting unit 60 sets measurement points in accordance with a value indicating these the measurement intervals specified by determination unit 62.

The shot position setting unit 54 loads actual measurement data on a position of a chip at the measurement point set by the measurement point setting unit 60 from the data storage unit 52, and sets a shot position to be optimum at the time of the probe contact control on the basis of the loaded actual measurement data on the position of the chip.

The variation range calculation unit 56 calculates a variation range (displacement amount) of a probe contact position of each of the chips on the basis of the shot position set by the shot position setting unit 54 and the actual measurement data on chip positions of all the chips stored in the data storage unit 52 as with the variation range displaying function.

The determination unit 62 gives an instruction related to setting or change of measurement points for which alignment is performed to the measurement point setting unit 60. In addition, the determination unit 62 acquires a calculation result of a variation range of a probe contact position of each of the chips with respect to the measurement point having been set or changed in accordance with the instruction, which calculation result is calculated by the shot position setting unit 54 and the variation range calculation unit 56.

Then, the determination unit 62 determines whether the calculation result of a variation range satisfies the alignment condition based on a condition value inputted from the condition value input unit 64, and then detects a setting of optimum measurement points (optimum measurement point setting) on the basis of a result of the determination.

Here, the determination unit 62 sets, as an alignment condition, performance of alignment control in a manner that the variation range of each of the chips becomes equal to or less than the condition value provided by the condition value input unit 64, and determines whether the variation range of each of the chips is equal to or less than the condition value.

In addition, the determination unit 62 obtains a setting, in which the number of measurement points becomes minimum, as the optimum measurement point setting from among settings of measurement points satisfying the alignment condition.

The condition value input unit 64 allows the monitor (output means) 44 to display a condition setting screen for inputting a condition value related to an alignment condition in its screen, and acquires the condition value that is inputted in the condition setting screen by the user by operating the operation unit 42, and then provides the condition value for the determination unit 62.

The result image generation unit 58 generates a result image for providing information related to the setting of optimum measurement points detected by determination unit 62 for the user, and allows the monitor 44 to display the result image in its screen.

Next, a processing content and a processing procedure of each of the processing units 50 to 64 in the first mode of the automatic measurement point calculation function will be described with reference to the flow chart of FIG. 15.

Figure 15:
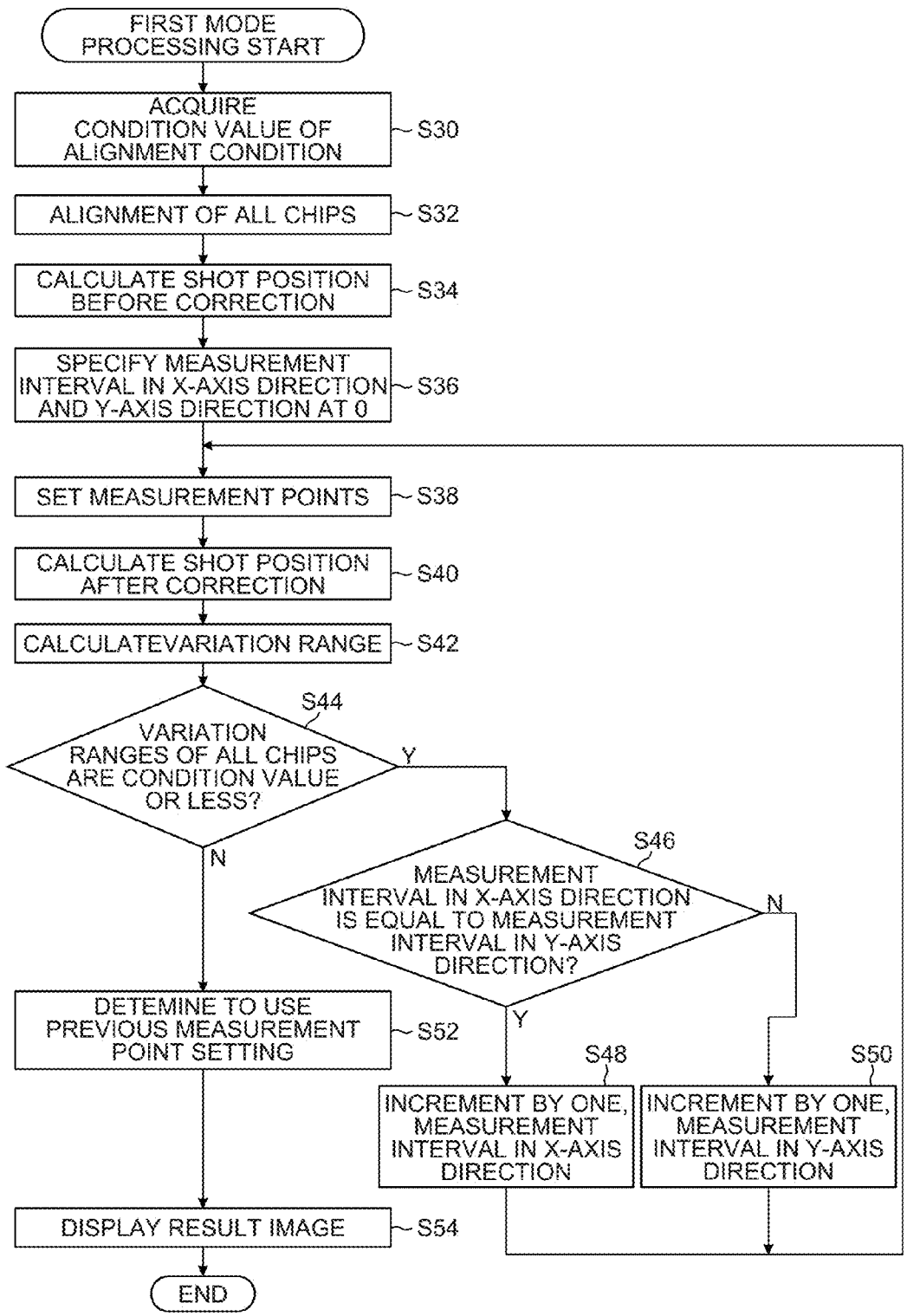
FIG. 15 is a flow chart showing a processing procedure in the first mode of the automatic measurement point calculation function.

When an operator selects execution of the first mode of the automatic measurement point calculation function in a screen of alignment utility by operating the operation unit 42, processing according to the flow chart of FIG. 15 starts.

First, as processing in step S30, the condition value input unit 64 allows the monitor 44 to display the condition setting screen, obtains a condition value of an alignment condition inputted by a user, and gives the condition value to the determination unit 62. The condition value indicates a limit value (upper limit value) allowable for a variation range of each of the chips.

Next, as processing in step S32, the chip position actual measurement data acquisition unit 50, as with step S10 described above, mounts one of a large number of the wafers W to be inspected on the wafer stage 18 as a sample wafer to perform alignment (alignment of all chips) for all chips (dies) by using the wafer alignment camera 23.

Accordingly, a position of every chip of the wafer W is measured (actual measurement), and a position of each of the chips that is actually measured is stored in the data storage unit 52 as the actual measurement data on chip positions.

Since the processing in step S32 is required to be performed for the sample wafer W to be inspected only once, it is unnecessary to perform the processing in step S32 if the actual measurement data on chip positions of the wafer W to be inspected has already been stored in the data storage unit 52.

Next, as processing in step S34, the shot position setting unit 54 loads the design data related to arrangement (position) of chips of wafer W before dicing, which is the same kind of the wafer W to be inspected, and design data related to arrangement (position) of the probes 26 of the probe card 25, from the data storage unit 52.

Then, there is set a shot position for allowing the probe 26 to be brought into contact with an ideal contact position for each of chips of the wafer W before dicing at the time of the probe contact control. The shot position set here indicates a shot position before correction as described above.

Next, as processing in step S36, the determination unit 62 instructs the measurement point setting unit 60 to set a measurement interval of measurement points in each of the X-axis direction and Y-axis direction at 0 (zero).

Subsequently, as processing in step S38, the measurement point setting unit 60 sets measurement points in accordance with the value of the measurement interval of measurement points in each of the X-axis direction and Y-axis direction instructed by the determination unit 62. In the processing in step S38 immediately after the processing in step S36, the measurement point setting unit 60 set all the chips in the wafer W, as chips to be measurement points.

Next, as processing in step S40, the shot position setting unit 54 loads from the data storage unit 52 the actual measurement data on chip positions of the chips to be the measurement points set by the measurement point setting unit 60.

Then, the shot position setting unit 54 corrects each of the shot positions before correction set in step S34 on the basis of the actual measurement positions of the chips to be the measurement points (positions indicated by the chip position actual measurement data), and sets a shot position where the probe 26 can be optimally brought into contact with a position of each of the chips, as a shot position after correction.

Here, a correction method of a shot position will be described.

First, positions of chips (non-measurement points) other than the chips to be the measurement points are calculated (estimated) on the basis of an actual measurement position of the chips to be the measurement points. For example, a position of each of the chips to be non-measurement points is calculated by assuming that each of the chips to be the non-measurement points arranged between two chips adjacent to each other in the X-axis direction (in the same line) among chips to be respective measurement points is arranged at equal intervals in a straight line connecting actual measurement positions of the chips to be the two measurement points. That is, the position of each of the chips to be non-measurement points is calculated by assuming that a position of each of the chips at the respective non-measurement points arranged between the chips at the two respective measurement points has an error that is linear (straight-line like) with respect to an error of the actual measurement position of the chip at each of two measurement points adjacent to each other (an error with respect to a position of the design data).

Likewise, it is possible to calculate a position of a chip to be a non-measurement point arranged between chips to be two respective measurement points adjacent to each other in the Y-axis direction. In addition, likewise, based on the positions of the chips to be non-measurement points which are calculated in this way, it is possible to calculate positions of other chips to be non-measurement points arranged between the calculated positions of the chips.

Note that a method of calculating a position of a non-measurement point on the basis of an actual measurement position of a chip at a measurement point is not limited to the above, and an arbitrary method is applicable.

Next, on the basis of the position of each of the chips acquired as described above (an actual measurement position of each of chips to be measurement points, and the calculated position of each of chips to be non-measurement points as described above), the shot position setting unit 54 calculates a shot position where the probe 26 can be optimally brought into contact with the position of each of the chips and sets the shot position as a shot position after correction.

Figure 22A:
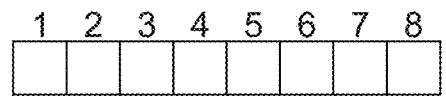
FIG. 22A is an explanatory diagram used to describe correction of shot positions.

Hereinafter, correction of a shot position will be described in a case where a probe card provided with probes 26 that are simultaneously brought into contact with eight chips arranged in an eight-by-one array as shown in FIG. 22A is used as the probe card 25 for multiple probing, for example. When the probes 26 of the probe card 25 are divided into ranges in each of which each probes 26 is brought into contact with one chip, the divided ranges are indicated as sites 1 to 8 in FIGS. 22A to 22E.

As the correction method of a shot position, for example, any form of the following correction method is applicable: correction based on a position of the site 1; correction based on diagonal edges of multiple sites; correction based on all multiple sites; and the like.

In the correction based on a position of the site 1, at each shot position, the shot position setting unit 54 corrects a shot position on the basis of a position of a chip with which the probe 26 at the site 1 is brought into contact. Specifically, each shot position is corrected so that a contact position of the probe 26 at the site 1 with respect to the chip coincides with the ideal contact position, that is, an error (the displacement amount from the ideal contact position) of the contact position of the probe 26 at the site 1 with respect to the chip is eliminated.

Figure 22B:
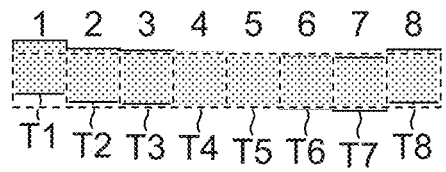
FIG. 22B is an explanatory diagram used to describe the correction of the shot positions.

For example, in a certain shot position, it is assumed that there is an error (error from a position of design data) of a position (an actual measurement position and a calculated position) of a chip with which the probe 26 at each of the sites 1 to 8 of the probe card 25 is simultaneously brought into contact, such as a position shown by each of chips T1 to T8 of FIG. 22B, and a contact position of each of the sites 1 to 8 of the probe card 25 with respect to the chips T1 to T8 in a setting of the shot position before correction is set as shown by a broken line.

Figure 22C:
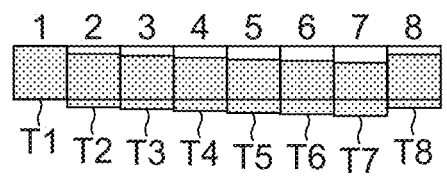
FIG. 22C is an explanatory diagram used to describe the correction of the shot positions.

In this case, if the correction based on the position of the site 1 is performed, a shot position after correction is set so that there is no error of a contact position of the probe 26 at the site 1 with respect to the chip T1, as shown in FIG. 22C.

In the correction based on diagonal edges of multiple sites, at each shot position, the shot position setting unit 54 corrects a shot position on the basis of a position of a chip contacting with the probe 26 of a lower left side and a position of a chip contacting with the probe 26 at an upper right site, among the sites of the probe card 25. Specifically, in the setting of the shot position before correction, an average of an error of a contact position of the probe 26 at the lower left site of the probe card 25 with a chip and an error of a contact position of the probe 26 at the upper right site with a chip is calculated, and then a shot position is corrected by displacing the shot position so that the error (the average of the error) is cancelled.

For example, in a case of a probe card 25 for multiple probing for one line shown in FIG. 22A, the site 1 of the probe card 25 corresponds to the lower left site, and the site 8 thereof corresponds to the upper right site. In the shot position before correction, an average of an error of a contact position of the probe 26 at the site 1 and an error of a contact position of the probe 26 at the site 8 is calculated, and then a shot position after correction is set by displacing the shot position so that the error is canceled.

Figure 22D:
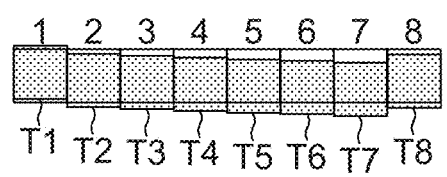
FIG. 22D is an explanatory diagram used to describe the correction of the shot positions.

FIG. 22D shows a shot position after correction (positions at which the probes 26 at the respective sites 1 to 8 are brought into contact with the respective chips T1 to T8) at the time when the correction based on diagonal edges of multiple sites is performed in a case where an error occurs in a position of each of the chips T1 to T8 with which the probe 26 at each of the sites 1 to 8 of the probe card 25 is simultaneously brought into contact, in a certain shot position, as shown in FIG. 22B.

In the correction based on all multiple sites, at each shot position, the shot position setting unit 54 corrects a shot position on the basis of a position of each of chips with which respective probes 26 at all the sites of the probe card 25 are brought into contact. Specifically, in the setting of the shot position before correction, an average of errors in contact positions of the probes 26 at all the sites of the probe card 25 with chips is calculated, and then a shot position is corrected by displacing the shot position so that the error (the average of the error) is canceled. In a case of the probe card 25 shown in FIG. 22A, an average of an error of contact positions of the probes 26 at all the sites 1 to 8 is acquired, and then a shot position after correction is set by displacing the shot position so that the error is canceled.

Figure 22E:
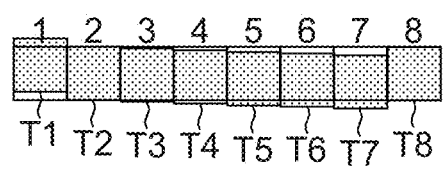
FIG. 22E is an explanatory diagram used to describe the correction of the shot positions.

FIG. 22E shows a shot position after correction (positions of the probes 26 at the sites 1 to 8 with respect to the respective chips T1 to T8) at the time when the correction based on diagonal edges of all the multiple sites is performed in a case where an error occurs in a position of each of the chips T1 to T8 with which the probe 26 at each of the sites 1 to 8 of the probe card 25 is simultaneously brought into contact, in a certain shot position, as shown in FIG. 22B.

The forms of the correction method of a shot position as above are applicable to processing when a shot position is corrected in the present embodiment. In addition, the correction method of any of the forms described above is applicable to the correction of a shot position (the processing in step S18 of the flow chart of FIG. 4) in the variation range displaying function, which has already been described. Further, the correction of a shot position is not limited to the forms described above, and any method may be applicable as long as an error of a contact position of the probe 26 at each site of the probe card 25 decreases as a whole as compared with the shot position before correction.

Returning to the flow chart of FIG. 15, subsequently, as processing in step S42, the variation range calculation unit 56 loads the actual measurement data on chip positions of all the chips, and the design data related to arrangement (position) of the probes 26 of the probe card 25, from the data storage unit 52. Then, for the wafer W to be inspected, in a case where the probes 26 are brought into contact with chips at the shot position after correction set in step S40, a variation range of a contact position, from the ideal contact position, at which each probe 26 of the probe card 25 is brought into contact with each of chips arranged in the actual measurement position is calculated on the basis of the data above.

Next, as processing in step S44, the determination unit 62 compares the variation range of each of the chips calculated by the variation range calculation unit 56 in step S42 with the condition value provided by the condition value input unit 64 in step S30 to determine whether a variation range of all the chips is equal to or less than the condition value.

As a result, if it is determined as YES, the processing proceeds to step S46, and if it is determined as NO, the processing proceeds to step S52.

As processing in step S46 in a case where it is determined as YES in step S44, the determination unit 62 determines whether a current value of a measurement interval in the X-axis direction is equal to a current value of a measurement interval in the Y-axis direction. As a result, if it is determined as YES, the processing proceeds to step S48, and if it is determined as NO, the processing proceeds to step S50.

As processing in step S48 in a case where it is determined as YES in step S46, the determination unit 62 increments, by one, the current value of a measurement interval in the X-axis direction, and specifies the incremented value to the measurement point setting unit 60. The current value of a measurement interval in the Y-axis direction is specified as it is (unchanged), and then the processing returns to the processing in step S38.

Accordingly, from step S38 to step S42, a variation range of each of the chips is calculated for a setting of measurement points in which the measurement interval in the X-axis direction is increased by one chip to reduce the number of measurement points, and then in step S44, it is determined whether the variation range of all the chips is equal to or less than the condition value.

As processing in step S50 in a case where it is determined as NO in step S46, the determination unit 62 increments, by one, the current value of a measurement interval in the Y-axis direction, and specifies the incremented value to the measurement point setting unit 60. The current value of a measurement interval in the X-axis direction is specified as it is (unchanged), and then the processing returns to the processing in step S38.

Accordingly, from step S38 to step S42, a variation range of each of the chips is calculated for a setting of measurement points in which the measurement interval in the Y-axis direction is increased by one chip to reduce the number of measurement points, and then in step S44, it is determined whether the variation range of all the chips is equal to or less than the condition value.

Here, in a case where it is determined as YES in step S44, that is, in a case where the variation range of all the chips is equal to or less than the condition value, the alignment condition related to a variation range, desired by the user, is satisfied. As a result, it is possible to further reduce the number of measurement points. Thus, from step S46 to step S50, processing of alternately increasing the measurement interval in the X-axis direction and the measurement interval in the Y-axis direction is performed.

Figure 16A:
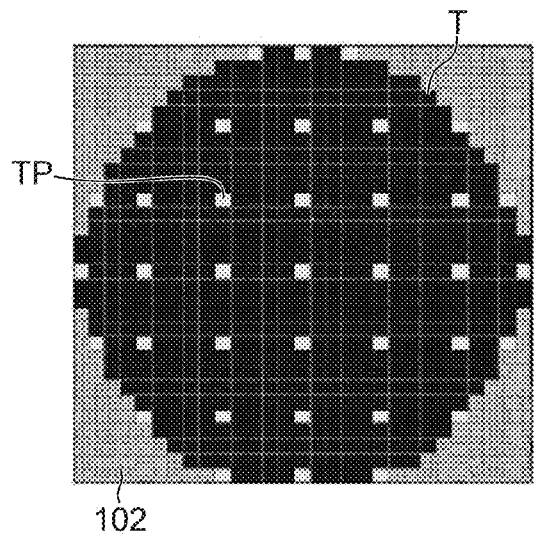
FIG. 16A shows a state where a measurement interval is increased by using a chart in which each of chips of the wafer W is shown by a quadrangular area as with FIG. 5.
Figure 16B:
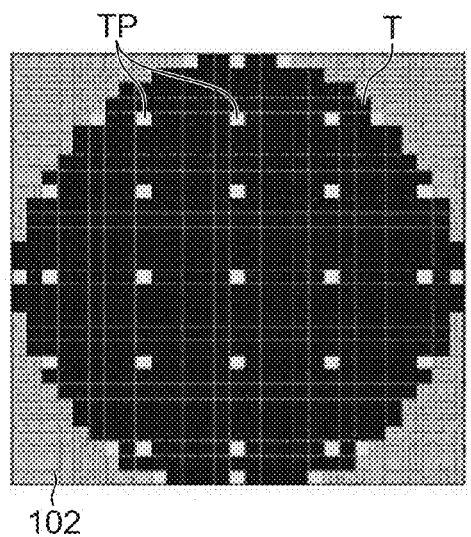
FIG. 16B shows a state where a measurement interval is increased by using a chart in which each of the chips of the wafer W is shown by a quadrangular area as with FIG. 5.
Figure 16C:
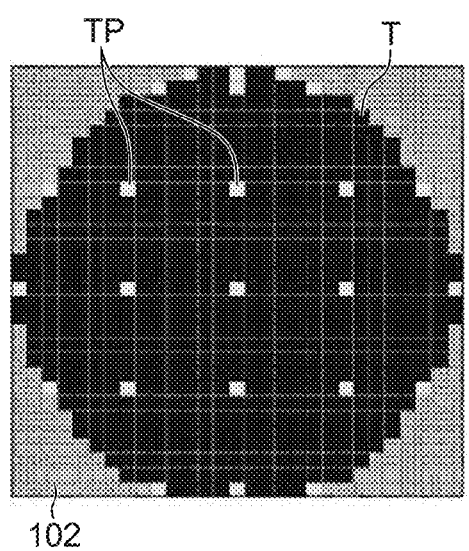
FIG. 16C shows a state where a measurement interval is increased by using a chart in which each of the chips of the wafer W is shown by a quadrangular area as with FIG. 5.

Each of FIGS. 16A to 16C, as with FIG. 5, shows a state in which a measurement interval is increased by using a diagram in which each of the chips of the wafer W is indicated by the quadrangular area 102, and an interval (measurement interval) between chips TP to be measurement points, among chips in the wafer W, gradually increases in the order of FIGS. 16A, 16B, and 16C.

On the other hand, returning to FIG. 15, in a case where it is determined as NO in step S44, as processing in step S52, the determination unit 62 changes the lastly changed value among the current value of a measurement interval in the X-axis direction and the current value of a measurement interval in the Y-axis direction, that is, a value of a measurement interval changed by processing performed last in one of the processing in step S48 and step S50, to be a value decreased by one. As to the other measurement interval, the value is left unchanged (keep the current value).

Then, a setting (setting state) of measurement points arranged based on the measurement intervals in the X-axis direction and Y-axis direction acquired by the processing above is determined as a setting of optimum measurement points (optimum measurement point setting). That is, a setting of measurement points immediately before a setting when the alignment condition related to a variation range, desired by a user, is not satisfied, is determined as a setting of optimum measurement points. The setting indicates a setting in which the number of measurement points is minimum among settings satisfying the alignment condition.

Subsequently, as processing in step S54, the result image generation unit 58 generates a result image for displaying the setting of optimum measurement points determined in step S52 to allow the monitor 44 to display the result image in its screen.

For example, a chart such as FIGS. 16A to 16C, which shows a value of a measurement interval of each of the X-axis direction and Y-axis direction, a total number of measurement points and chips to be measurement points in the optimum measurement point setting, is displayed in the screen of the monitor 44 as the result image.

In addition, with respect to the optimum measurement point setting, a maximum value and a minimum value in the variation range of respective chips, and a variation range display image as shown in FIGS. 9 to 11, may be displayed in the screen of the monitor 44 on the basis of the variation range of each chip calculated by the processing from step S38 to step S42 of FIG. 15.

In the processing procedure shown in FIG. 15, the number of measurement points are sequentially reduced so as to detect a measurement point setting at the time when a variation range of all the chips becomes equal to or less than the condition value, and then a setting immediately before such the measurement point setting is set as an optimum measurement point setting. Other than that, the number of measurement points may be sequentially increased so as to detect a measurement point setting at the time when a variation range of all the chips becomes equal to or less than the condition and to set such the setting as an optimum measurement point setting.

That is, a variation range is calculated by sequentially changing a measurement point setting by using any of the methods above, and then among the measurement point settings, a measurement point setting in which a variation range of all the chips is equal to or less than the condition value and the number of measurement points becomes minimum, may be detected so as to be determined as the optimum measurement point setting. Also in the second mode below, modifications for a similar purpose are possible.

Next, the automatic measurement point calculation function of the second mode will be described.

In the control unit 40, processing units configured in the control unit 40 by executing using the CPU, a program of performing the second mode of the automatic measurement point calculation function have the same configuration as that in the block diagram shown in FIG. 13, so that description of the processing units is omitted.

Since processing contents of the measurement point setting unit 60 and the determination unit 62 are different from those on the first mode, the processing contents will be described with reference to a processing content and a processing procedure of each of the processing units 50 to 64 in the second mode of the automatic measurement point calculation function, with reference to the flow chart of each of FIGS. 17 and 18. In the flow chart of FIG. 17, step in which the same processing as that in the first mode is performed is designated by the same step number as that of the first mode.

Figure 17:
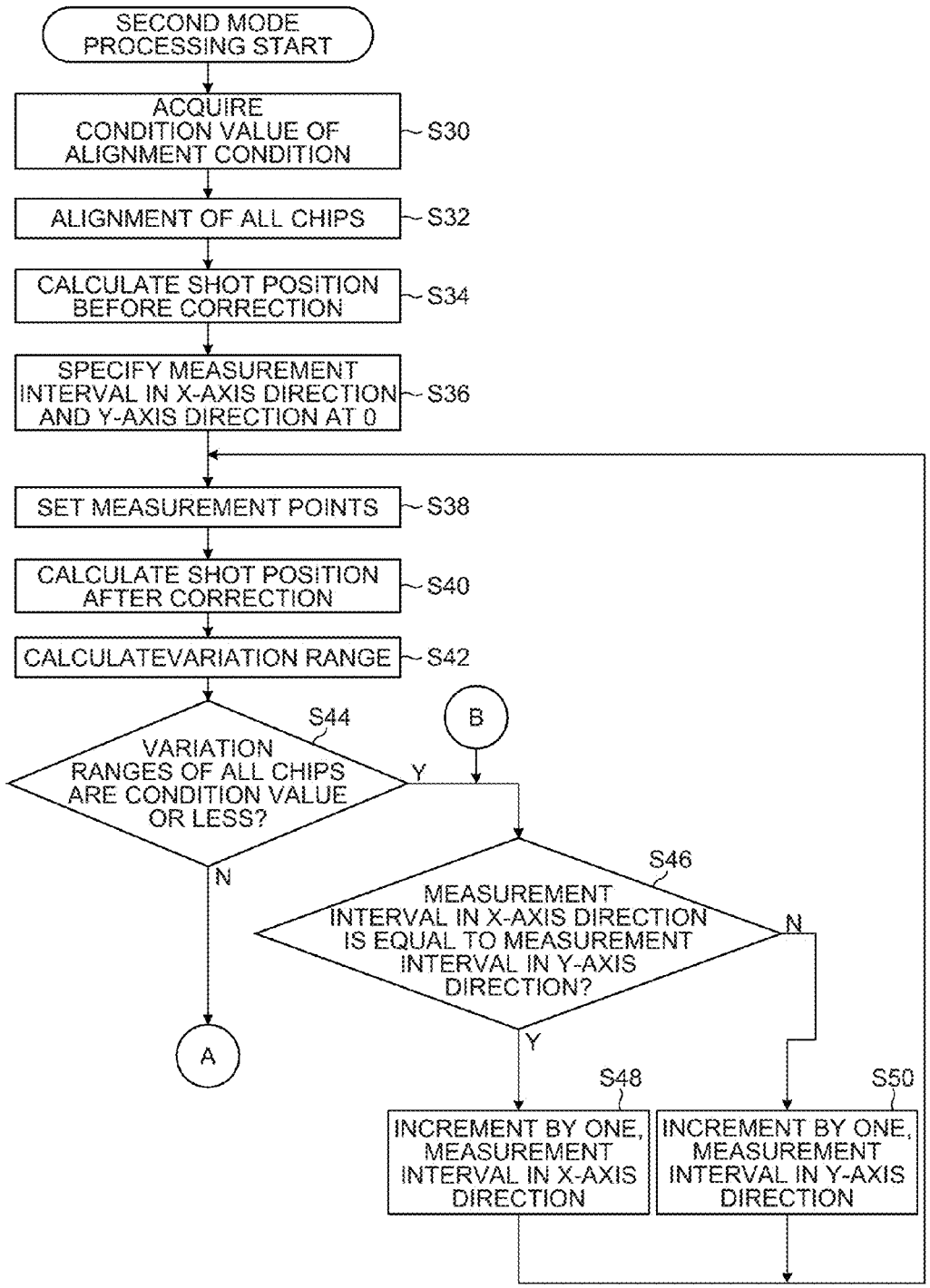
FIG. 17 is a flow chart showing a processing procedure in a second mode of the automatic measurement point calculation function.

When an operator selects execution of the second mode of the automatic measurement point calculation function in a screen of alignment utility by operating the operation unit 42, processing according to the flow chart of FIG. 17 starts.

First, as processing in step S30, the condition value input unit 64 allows the monitor 44 to display the condition setting screen, obtains a condition value of an alignment condition inputted by a user, and sends the condition value to the determination unit 62. The condition value indicates a limit value (upper limit value) allowable for a variation range of each of chips.

Next, as processing in step S32, the chip position actual measurement data acquisition unit 50 mounts one of a large number of the wafers W to be inspected on the wafer stage 18 as a sample wafer to perform alignment (alignment of all chips) for all chips (dies) by using the wafer alignment camera 23.

Accordingly, a position of every chip of the wafer W is measured (actual measurement), and a position of each of the chips that is actually measured is stored in the data storage unit 52 as the actual measurement data on chip positions.

Since the processing in step S32 is required to be performed for the sample wafer W to be inspected only once, it is unnecessary to perform the processing in step S32 if the actual measurement data on chip positions of the wafer W to be inspected has already been stored in the data storage unit 52.

Next, as processing in step S34, the shot position setting unit 54 loads the design data related to arrangement (position) of chips of wafer W before dicing, which is the same kind of the wafer W to be inspected, and design data related to arrangement (position) of the probes 26 of the probe card 25, from the data storage unit 52.

Then, there is set a shot position for allowing the probe 26 to be brought into contact with an ideal contact position for each of chips of the wafer W before dicing at the time of the probe contact control. The shot position set here indicates a shot position before correction.

Next, as processing in step S36, the determination unit 62 instructs the measurement point setting unit 60 to set a measurement interval of measurement points in each of the X-axis direction and Y-axis direction at 0 (zero).

Subsequently, as processing in step S38, the measurement point setting unit 60 sets measurement points in accordance with a value of the measurement interval of measurement points in each of the X-axis direction and Y-axis direction instructed by the determination unit 62. In the processing in step S38 immediately after the processing in step S36, the measurement point setting unit 60 set all the chips in the wafer W as a chip to be a measurement point.

Here, as to a determined range in which chips to be a measurement point have been already determined as discussed below, measurement points are set in accordance with that determination.

Next, as processing in step S40, the shot position setting unit 54 loads from the data storage unit 52 the actual measurement data on chip positions of the chips to be the measurement points set by the measurement point setting unit 60.

Then, the shot position setting unit 54 corrects the shot positions before correction set in step S34 on the basis of the actual measurement positions of the chips to be the measurement points and sets a shot position where the probe 26 can be optimally brought into contact with a position of each of the chips, as a shot position after correction.

Next, as processing in step S42, the variation range calculation unit 56 loads the actual measurement data on a position of every chip, and the design data related to arrangement (position) of the probes 26 of the probe card 25, from the data storage unit 52. Then, for the wafer W to be inspected, in a case where the probes 26 are brought into contact with the chips at the shot position after correction set in step S38, a variation range of a contact position, from the ideal contact position, at which each probe 26 of the probe card 25 is brought into contact with each of chips arranged in the actual measurement position is calculated on the basis of the data above.

Subsequently, as processing in step S44, the determination unit 62 compares the variation range of each of the chips calculated by the variation range calculation unit 56 in step S42 with the condition value provided by the condition value input unit 64 in step S30 to determine whether a variation range of all the chips is equal to or less than the condition value.

Figure 18:
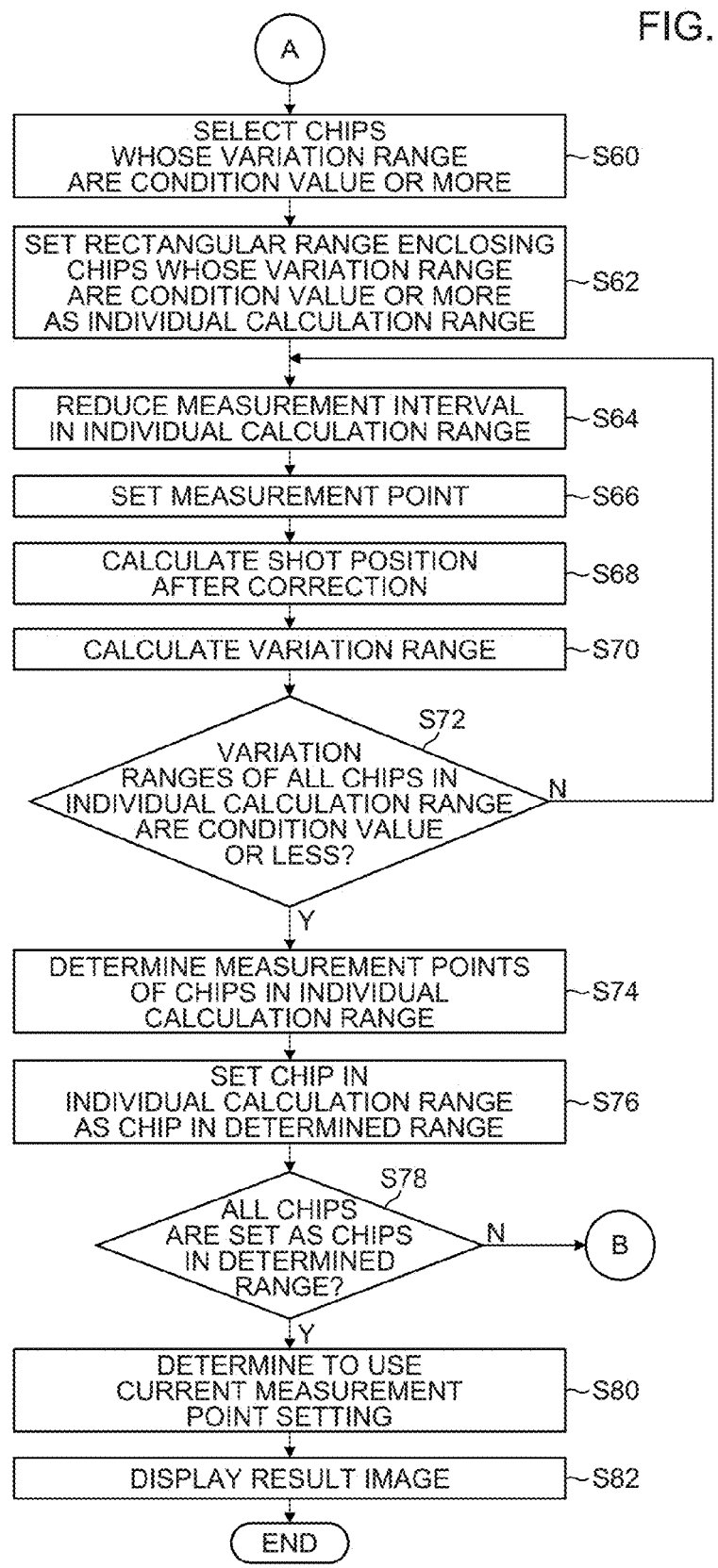
FIG. 18 is a flow chart showing a processing procedure in the second mode of the automatic measurement point calculation function.

As a result, if it is determined as YES, the processing proceeds to step S46, and if it is determined as NO, the processing proceeds to step S60 of FIG. 18.

As processing in step S46 in a case where it is determined as YES in step S44, the determination unit 62 determines whether a current value of a measurement interval in the X-axis direction is equal to a current value of a measurement interval in the Y-axis direction. As a result, if it is determined as YES, the processing proceeds to step S48, and if it is determined as NO, the processing proceeds to step S50.

As processing in step S48 in a case where it is determined as YES in step S46, the determination unit 62 increments, by one, the current value of a measurement interval in the X-axis direction, and specifies the incremented value to the measurement point setting unit 60. The current value of a measurement interval in the Y-axis direction is specified as it is (unchanged), and then the processing returns to the processing in step S38.

Accordingly, from step S38 to step S42, a variation range of each of the chips is calculated for a setting of measurement points in which the measurement interval in the X-axis direction, other than a determined range in which a chip at a measurement point has been determined, is increased by one chip to reduce the number of measurement points, and then in step S44, it is determined whether the variation range of all the chips is equal to or less than the condition value.

As processing in step S50 in a case where it is determined as NO in step S46, the determination unit 62 increments, by one, the current value of a measurement interval in the Y-axis direction, and specifies the incremented value to the measurement point setting unit 60. The current value of a measurement interval in the X-axis direction is specified as it is (unchanged), and then the processing returns to the processing in step S38.

Accordingly, from step S38 to step S42, a variation range of each of the chips is calculated for a setting of measurement points in which the measurement interval in the Y-axis direction, other than a determined range in which a chip at a measurement point has been determined, is increased by one chip to reduce the number of measurement points, and then in step S44, it is determined whether the variation range of all the chips is equal to or less than the condition value.

On the other hand, in a case where it is determined as NO in step S44, as processing in step S60 of FIG. 18, the determination unit 62 selects chips in each of which the variation range is equal to or more than the condition value.

Next, as processing in step S62, the determination unit 62 sets a rectangular range enclosing the chips selected in step S60 as an individual calculation range. Here, a shot position including the chips selected in step S44 may be selected so that a minimum range including the selected shot position is set as the individual calculation range.

Subsequently, as processing in step S64, the determination unit 62 instructs the measurement point setting unit 60 to reduce a measurement interval in the individual calculation range to increase the measurement points. Specifically, the determination unit 62 alternately instructs the following: an instruction that a measurement interval in the Y-axis direction is set at a current value, and a measurement interval in the X-axis direction is set at a value obtained by decreasing by one from a current value; and an instruction that the measurement interval in the X-axis direction is set at the current value, and the measurement interval in the Y-axis direction is set at a value obtained by decreasing by one from the current value. This designation is alternately performed every time when processing of this step S64 is repeated.

Next, as processing in step S66, the measurement point setting unit 60 sets measurement points, for chips in the individual calculation range set by the determination unit 62 in accordance with the value of the measurement interval in each of the X-axis direction and Y-axis direction specified by the determination unit 62.

Figure 19:
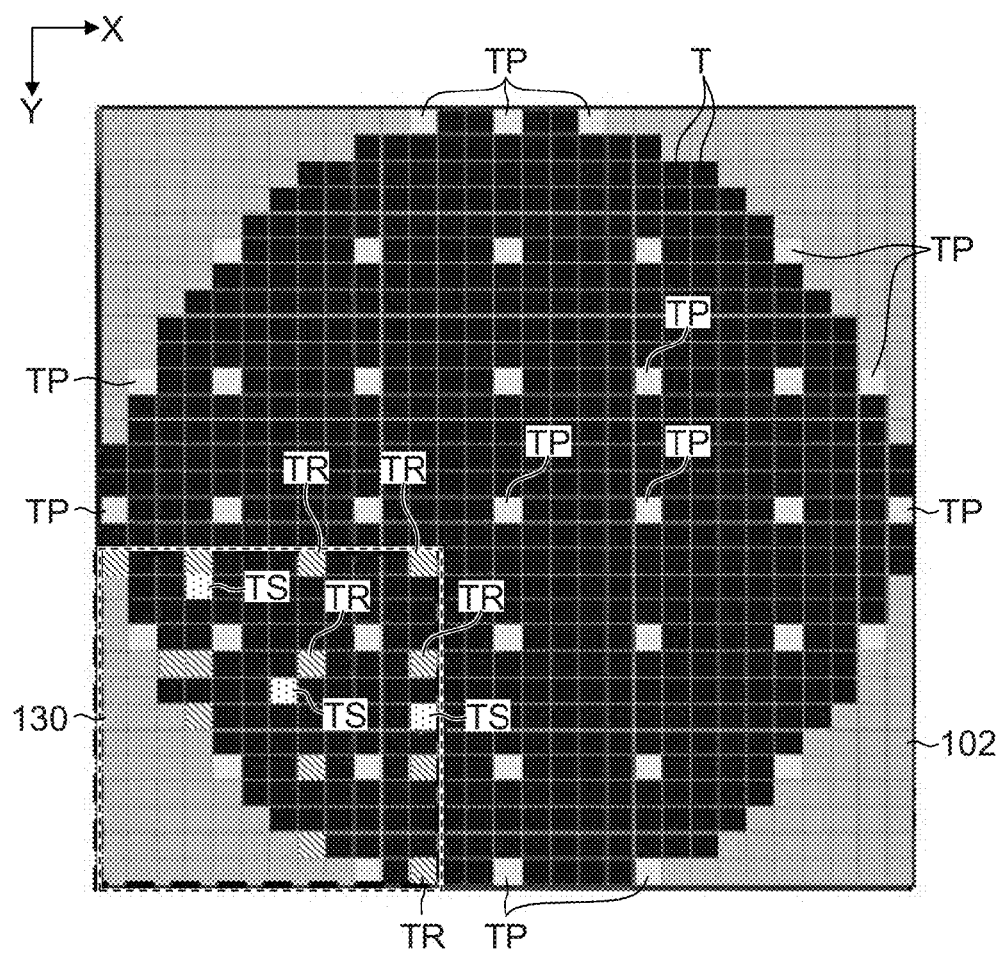
FIG. 19 shows a state of setting a measurement interval in an individual calculation range by using a chart in which each of chips of the wafer W is shown by a quadrangular area as with FIG. 5.

Here, FIG. 19 shows a state where a measurement interval in an individual calculation range is set by using a chart indicating each of the chips of the wafer W by the quadrangular area 102 as with FIG. 5. When the chips selected in step S60 are three chips designated by the reference character TS in FIG. 19, a range including the chips TS is set as an individual calculation range 130 in step S62. Then, in step S64 and step S66, the chips designated by the reference character TR are set as chips to be measurement points in the individual calculation range 130. In the individual calculation range 130, a measurement point setting is newly performed regardless of measurement points arranged outside the individual calculation range 130 so that chips in the periphery of the individual calculation range 130 are set as chips to be measurement points.

Returning to FIG. 18, subsequently, as processing in step S68, the shot position setting unit 54 loads the actual measurement data on a position of every chip to be the measurement point in the individual calculation range set by the measurement point setting unit 60 from the data storage unit 52.

Then, the shot position before correction in the individual calculation range set in step S34 is corrected on the basis of the actual measurement position of each chip to be the measurement point in the individual calculation range so that a shot position in which each probe 26 can be optimally brought into contact with each chip in the individual calculation range is set as a shot position after correction.

Next, as processing in step S70, the variation range calculation unit 56 loads the actual measurement data on a position of every chip in the individual calculation range, and the design data related to arrangement (position) of the probes 26 of the probe card 25, from the data storage unit 52. Then, in a case where the probes 26 are brought into contact at the shot position after correction set in step S68, the variation range calculation unit 56 calculates a variation range of a contact position, at which each probe 26 of the probe card 25 is brought into contact with each of chips arranged in the actual measurement position, from the ideal contact position, for the individual calculation range of the wafer W on the basis of the above data.

Subsequently, as processing in step S72, the determination unit 62 compares the variation range of each of the chips in the individual calculation range, calculated by the variation range calculation unit 56 in step S70, with the condition value provided by the condition value input unit 64 in step S30 and determines whether a variation range of every chip is equal to or less than the condition value. If it is determined as NO, the processing returns to step S64, and then the measurement interval is reduced to increase the number of measurement points, so that the processing from step S66 to step S72 is repeated.

On the other hand, if it is determined as YES, as processing in step S74, the determination unit 62 determines the current setting of measurement points in the individual calculation range as a setting of optimum measurement points (optimum measurement point setting).

Then, as processing in step S76, the determination unit 62 sets the chips in the individual calculation range as a chip in a determined range.

Next, as processing in step S78, the determination unit 62 determines whether all the chips of the wafer W are set as a chip in the determined range. If it is determined as NO, the processing proceeds to step S46 of FIG. 17, and if it is determined as YES, the processing proceeds to step S80.

In the processing from step S46 in a case where it is determined as NO in step S78, with respect to a range that has already been set as a determined range, a measurement point is not changed to be fixed at the measurement point determined in step S74. In addition, the calculation of a variation range in step S42, and the determination in step S44, may not be performed for the determined range.

On the other hand, as processing in step S80 in a case where it is determined as YES in step S78, the determination unit 62 determines a setting of measurement points having been determined in each determined range, as an optimum measurement point setting.

Then, as processing in step S82, the result image generation unit 58 generates a result image for displaying the setting of optimum measurement points determined in step S80 and the monitor 44 displays the result image in its screen.

For example, the monitor 44 displays in the screen, as the result image, a chart showing a value of a measurement interval of each of the X-axis direction and Y-axis direction, the number of measurement points, and the chips to be measurement points, in the optimum measurement point setting, such as FIG. 19, and so on.

In addition, regarding the optimum measurement point setting, a maximum value and a minimum value among variation ranges of respective chips, and a variation range display image as shown in FIGS. 9 to 11, may be displayed in the screen of the monitor 44 on the basis of the variation range of each chip, calculated by the processing from step S38 to step S42 of FIG. 17 (FIG. 15).

Next, the automatic measurement point calculation function of the third mode will be described.

Figure 20:
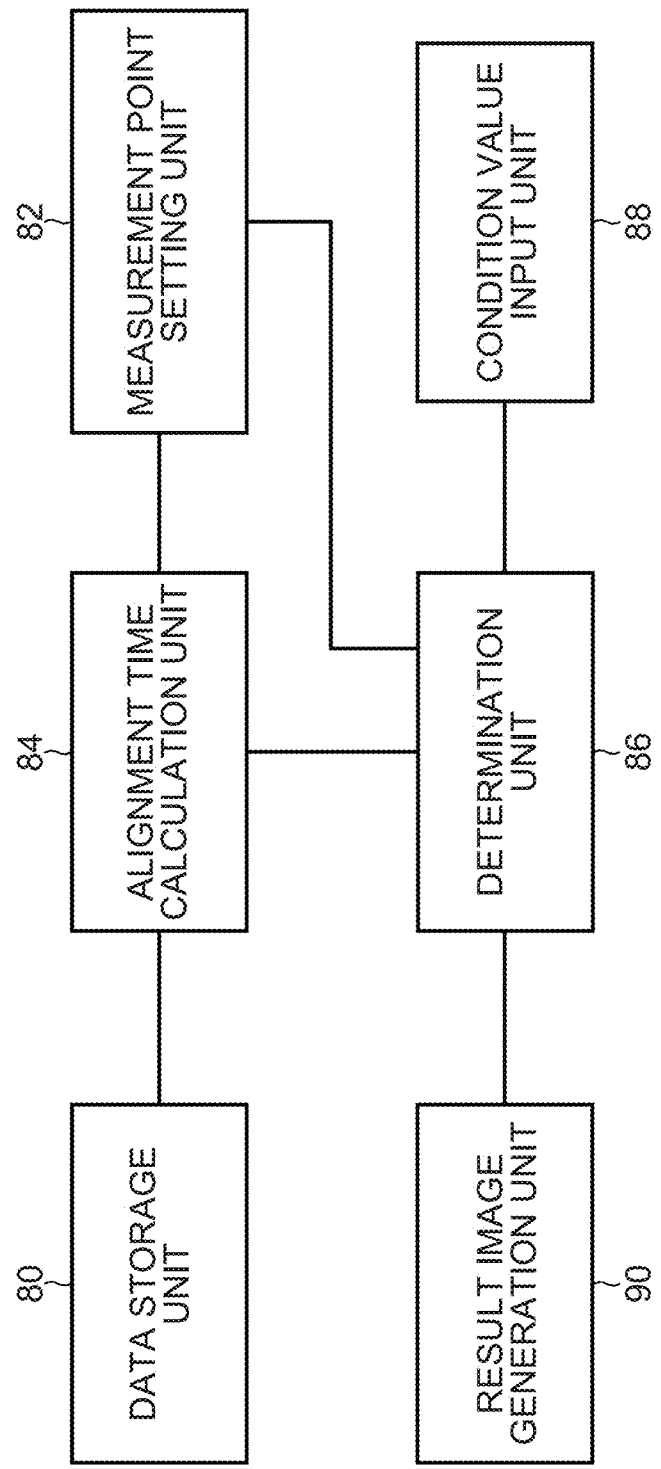
FIG. 20 is a block diagram showing processing units in a control unit, configured by executing using a CPU a program of performing a third mode of the automatic measurement point calculation function.

FIG. 20 is a block diagram showing processing units in the control unit 40, configured by executing using a CPU a program of performing the third mode of the automatic measurement point calculation function.

The data storage unit 80 corresponds to the data storage unit 52 shown in FIG. 3 and stores data required for calculation of alignment time, described below, such as: design data related to arrangement of chips of the wafer W to be inspected before dicing; and data related to control of the stage movement mechanism, such as a maximum speed, and acceleration, at the time when the wafer W mounted in the wafer stage 18 is moved by the stage movement mechanism.

The measurement point setting unit 82 sets chips for which alignment (actual measurement of a chip position (XY-coordinate)) is performed, as measurement points, as with the measurement point setting unit 60 described above.

That is, measurement points are set in accordance with the number of chips indicating the measurement interval in the X-axis direction and the number of chips (the number of lines) indicating the measurement interval in the Y-axis direction, specified by the determination unit 86.

When performing alignment control in accordance with the measurement points set by the measurement point setting unit 82, an alignment time calculation unit 84 calculates alignment time period (time (time period) required until every alignment of respective chips at measurement points is finished) required for the alignment control.

At that time, data related to arrangement (position) of the wafer W to be inspected, and information related to control of the stage movement mechanism, are loaded from the data storage unit 80 so that time required for movement between chips to be measurement points, and the like, are calculated.

The determination unit 86 sends an instruction related to setting and change of measurement points for which alignment is performed, to the measurement point setting unit 82, and obtains the alignment time calculated for the measurement point set and changed in accordance with the instruction by the alignment time calculation unit 84.

Then, the determination unit 86 determines whether the alignment time satisfies an alignment condition based on a condition value inputted from the condition value input unit 88, and detects an optimum measurement point setting on the basis of a result of the determination.

Here, the determination unit 86 sets, as an alignment condition, performance of alignment control in a manner that the alignment time becomes equal to or less than the condition value provided by the condition value input unit 88, and determines whether the alignment time is equal to or less than the condition value.

In addition, the determination unit 86 detects a setting, in which the number of measurement points becomes minimum, as the optimum measurement point setting, from among settings of measurement points satisfying the alignment condition. That is, the optimum measurement point setting shows to what extent the number of measurement points is to be reduced to allow the alignment time to be equal to or less than the condition value.

The condition value input unit 88 allows the monitor 44 to display a condition setting screen for inputting a condition value related to an alignment condition in its screen, and obtains a condition value that is inputted by a user by operating the operation unit 42 in the condition setting screen, and then gives the condition value to the determination unit 86.

The result image generation unit 90 generates a result image for providing information related to the setting of optimum measurement points detected by determination unit 86 for a user, and allows the monitor 44 to display the result image in its screen.

Next, a processing content and a processing procedure of each of the processing units 80 to 90 in the third mode of the automatic measurement point calculation function will be described with reference to the flow chart of FIG. 21.

When an operator selects execution of the third mode of the automatic measurement point calculation function in a screen of alignment utility by operating the operation unit 42, processing according to the flow chart of FIG. 12 starts.

First, as processing in step S100, the condition value input unit 88 allows the monitor 44 to display the condition setting screen, and obtains a condition value of an alignment condition inputted by a user, and gives the condition value to the determination unit 62. The condition value indicates a limit value (upper limit value) allowable for alignment time.

Next, as processing in step S102, the alignment time calculation unit 84 loads the following data from the data storage unit 80: design data related to arrangement (position) (data of an index size in each of the X-axis direction and Y-axis direction) of chips of wafer W before dicing, which is the same kind of the wafer W to be inspected; and data on a maximum speed and acceleration for moving the wafer W with the stage movement mechanism at the time of the alignment control.

Subsequently, as processing in step S104, the alignment time calculation unit 84 obtains a time period during which the wafer W is stopped and the wafer alignment camera 23 photographs the wafer W at the time of the alignment control, from the data storage unit 80.

Next, as processing in step S106, the determination unit 86 instructs the measurement point setting unit 82 to set a measurement interval of measurement points in each of the X-axis direction and Y-axis direction at 0 (zero).

Subsequently, as processing in step S108, the measurement point setting unit 82 sets measurement points in accordance with a value of the measurement interval of measurement points in each of the X-axis direction and Y-axis direction instructed by the determination unit 86. In the processing in step S108 immediately after the processing in step S106, the measurement point setting unit 82 sets all the chips in the wafer W, as chips to be measurement points.

Next, as processing in step S110, the alignment time calculation unit 84 calculates alignment time required for alignment of all the chips at the respective measurement points, or alignment time required for alignment control in which all the chips are set as a measurement point, when performing alignment of chips at the respective measurement points set by the measurement point setting unit 82, on the basis of the data loaded in step S102 and step S104.

Subsequently, as processing in step S112, the determination unit 86 compares the alignment time calculated by the alignment time calculation unit 84 in step S112 with the condition value provided by the condition value input unit 88 in step S100, and determines whether the calculated alignment time is equal to or less than the condition value.

As a result, if it is determined as NO, the processing proceeds to step S114, and if it is determined as YES, the processing proceeds to step S120.

As processing in step S114 in a case where it is determined as NO in step S112, the determination unit 86 determines whether a current value of a measurement interval in the X-axis direction is equal to a current value of a measurement interval in the Y-axis direction. As a result, if it is determined as YES, the processing proceeds to step S116, and if it is determined as NO, the processing proceeds to step S118.

As processing in step S116 in a case where it is determined as YES in step S114, the determination unit 86 increments, by one, the current value of a measurement interval in the X-axis direction, and specifies the incremented value to the measurement point setting unit 82. The current value of a measurement interval in the Y-axis direction is specified as it is (unchanged), and then the processing returns to the processing in step S108.

Accordingly, in step S108 and step S110, an alignment time is calculated for a setting of measurement points in which the measurement interval in the X-axis direction is increased by one chip to reduce the number of measurement points, and then in step S112, it is determined whether the alignment time is equal to or less than the condition value.

As processing in step S118 in a case where it is determined as NO in step S114, the determination unit 86 increments, by one, the current value of a measurement interval in the Y-axis direction, and specifies the incremented value to the measurement point setting unit 82. The current value of a measurement interval in the X-axis direction is specified as it is (unchanged), and then the processing returns to the processing in step S108.

Accordingly, in step S108 and step S110, there is calculated alignment time for a setting of measurement points in which the measurement interval in the Y-axis direction is increased by one chip to reduce the number of measurement points, and then in step S112, it is determined whether the alignment time is equal to or less than the condition value.

On the other hand, as processing in step S120 in a case where it is determined as YES in step S112, the determination unit 86 determines a setting of measurement points arranged at the current measurement interval in each of the X-axis direction and Y-axis direction as a setting of optimum measurement points (optimum measurement point setting).

Then, as processing in step S122, the result image generation unit 90 generates a display image for displaying the setting of optimum measurement points determined in step S120 to allow the monitor 44 to display the display image in its screen.

For example, a chart showing a value of a measurement interval of each of the X-axis direction and Y-axis direction in an optimum measurement point setting, a total number of measurement points, an alignment time in the setting of optimum measurement points, and chips to be optimum measurement points, such as FIG. 14, is displayed in the screen of the monitor 44 as a result image.

In addition, variation ranges in respective chips at the optimum measurement point setting are calculated by the processing from step S30 to step S34, and from step S38 to step S42, of FIG. 15. Then, on the basis of the variation ranges, a maximum value and a minimum value among the variation ranges in respective chips may be displayed by using a variation range display image, such as shown in FIGS. 9 to 11.

Figure 21:
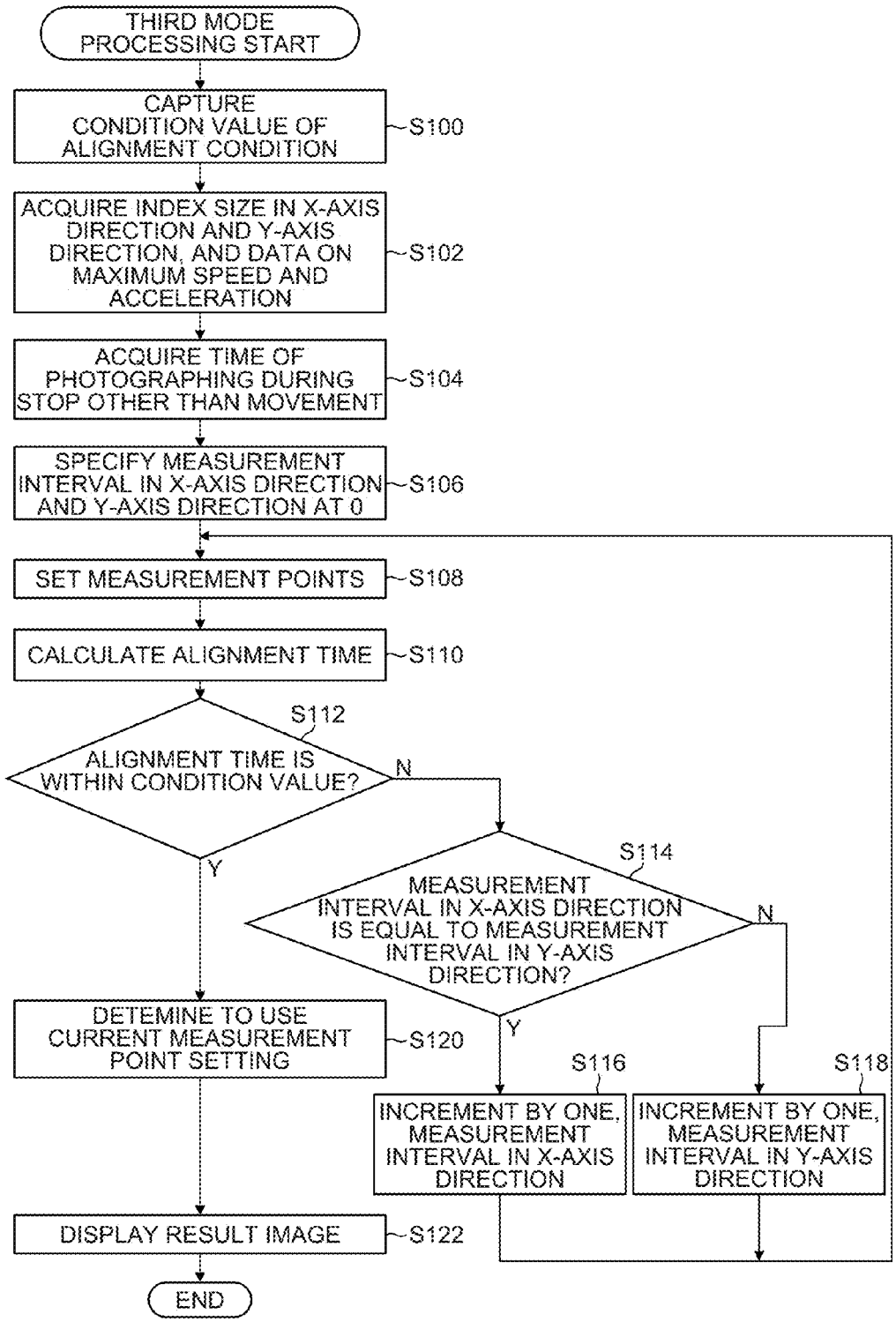
FIG. 21 is a flow chart showing a processing procedure in the third mode of the automatic measurement point calculation function.

In the processing procedure shown in FIG. 21, the number of measurement points is sequentially reduced so that a setting of measurement points at the time when alignment time becomes equal to or less than a condition value is detected to be set as an optimum measurement point setting. Other than that, the number of measurement points is sequentially increased so that a setting of measurement points at the time when the alignment time exceeds the condition value is detected, and then a setting immediately before the setting of measurement points may be set as the optimum measurement point setting. That is, an alignment time is calculated by sequentially changing a setting of measurement points by using any of the methods above, and among settings of measurement points, a setting of measurement points, in which alignment time is equal to or less than the condition value as well as the alignment time becomes maximum (the number of measurement points becomes maximum), may be detected to be determined as the optimum measurement point setting.

As above, in the embodiment described above, although a wafer after dicing which have been divided into individual chips is set as the wafer W to be inspected, the present invention is applicable to a case even where a wafer before dicing is set as the wafer W to be inspected, and the wafer W is not limited to a wafer of a specific form. In addition, although a card for multiple probing is used as the probe card 25, a card for single probing is also available.

In addition, the alignment utility function described in the embodiment above is not necessarily controlled by a control unit that controls the prober 10, and a device separated from the control unit that controls the prober 10 may be used as a device for performing the alignment utility function if the device is capable of acquiring necessary data through a recording medium, communication means, and the like, as an alignment support device (such as a computer).

What is claimed is:

1. An alignment support device for a probe device which brings probes of a tester into contact with a plurality of chips formed on a wafer, the alignment support device comprising:
    an actual measurement data acquisition unit configured to acquire actual measurement data showing an actual measurement position of all the chips of the wafer;
    a condition value input unit configured to input a condition value related to a variation amount of a position at which each probe is in contact with each of the chips when the chips are brought into contact with the probes;

a measurement point setting unit configured to set chips to which alignment is to be performed from among all the chips of the wafer, as measurement points;

a shot position setting unit configured to set, as a shot position, positions of the probes with respect to the wafer when each of the chips of the wafer is brought into contact with the probe at an ideal contact position, and corrects the set shot position based on the actual measurement position of chips to be the measurement points set by the measurement point setting unit;

a variation amount calculation unit configured to calculate the variation amount of a position of each of the chips of the wafer based on the actual measurement position of each of the chips when it is assumed that each of the chips of the wafer is brought into contact with the probe in accordance with the shot position after correction set by the shot position setting unit;

a determination unit configured to determine whether the variation amount of the position of each of the chips calculated by the variation amount calculation unit is equal to or less than the condition value inputted by the condition value input unit or not;

a measurement point changing unit configured to sequentially change a setting of the measurement points performed by the measurement point setting unit to a different setting;

an optimum measurement point determination unit configured to determine a setting of measurement points, in which the variation amount of each of the chips calculated by the variation amount calculation unit is equal to or less than the condition value and a number of the measurement points is minimum, as an optimum measurement point setting, from among the settings of the measurement points sequentially changed by the measurement point changing unit; and an output unit configured to output information related to the optimum measurement point setting determined by the optimum measurement point determination unit.

2. The alignment support device for a probe device according to claim 1, wherein the measurement point changing unit changes settings of the measurement points so that an interval between the measurement points sequentially increases, and the optimum measurement point determination unit determines a setting of measurement points at a time just before when the variation amount of a position in any one of all the chips of the wafer exceeds the condition value, as the optimum measurement point setting.

3. The alignment support device for a probe device according to claim 1, wherein the measurement point changing unit performs: a first changing processing of changing settings of the measurement points so that an interval between the measurement points sequentially increases; and a second changing processing of changing settings of the measurement points so that the interval between the measurement points sequentially decreases, and the optimum measurement point determination unit repeatedly performs:

an individual calculation range setting processing of changing a setting of measurement points other than a determined range in which a setting of measurement points is determined by performing the first changing processing, and setting a partial range including a chip in which the variation amount exceeds the condition value as an individual calculation range, when the variation amount in any one of all the chips of the wafer exceeds the condition value; and an individual calculation processing of changing settings of measurement points in the individual calculation range by performing the second changing processing, determining a setting of measurements point when the variation amount in each of all chips in the individual calculation range becomes equal to or less than the condition value, as an optimum measurement point setting in the individual calculation range, and setting the individual calculation range as the determined range, and repeats the individual calculation range setting processing and the individual calculation processing until all the chips of the wafer become chips within the determined range.

4. The alignment support device for a probe device according to claim 1, wherein the output unit outputs the number of measurement points in the setting of measurement points determined by the optimum measurement point determination unit.

5. The alignment support device for a probe device according to claim 2, wherein the output unit outputs an interval between the measurement points in the setting of the measurement points determined by the optimum measurement point determination unit.

6. The alignment support device for a probe device according to claim 1, wherein the shot position setting unit corrects the shot position so as to reduce the variation amount of the contact position of the probe with the chip from the ideal contact position.

7. The alignment support device for a probe device according to claim 1, wherein when the probe includes multiple probes, the shot position setting unit corrects the shot position based on the actual measurement position of chips which contact with probes at diagonal edges of the multiple probes.

8. The alignment support device for a probe device according to claim 1, wherein when the probe includes multiple probes, the shot position setting unit corrects the shot position so that an average of the variation amount of contact positions of respective multiple probes with the chips, from ideal contact positions is reduced.

9. An alignment support device for a probe device which brings probes of a tester into contact with a plurality of chips formed on a wafer, the alignment support device comprising:

a condition value input unit configured to input a condition value related to alignment time showing time required to alignment for measuring a position of each of chips of the wafer is finished;

a measurement point setting unit configured to set chips for which alignment is to be performed from among all the chips of the wafer, as measurement points;

an alignment time calculation unit configured to calculate an alignment time required when it is assumed that alignment is performed for the chips which are set as the measurement points by the measurement point setting unit;

a determination unit configured to determine whether the alignment time calculated by the alignment time calculation unit is equal to or less than the condition value inputted by the condition value input unit;

a measurement point changing unit configured to sequentially change a setting of the measurement points performed by the measurement point setting unit to a different setting;

an optimum measurement point determination unit configured to determine a setting of measurement points, in which the alignment time calculated by the alignment time calculation unit is equal to or less than the condition value, and a number of the measurement points is maximum, as an optimum measurement point setting, from among settings of the measurement points sequentially changed by the measurement point changing unit; and an output unit configured to output information related to the optimum measurement point setting determined by the optimum measurement point determination unit.

10. The alignment support device for a probe device according to claim 9, wherein the measurement point changing unit changes settings of the measurement points so that an interval between the measurement points sequentially increases, and the optimum measurement point determination unit determines a setting of measurement points when the alignment time becomes equal to or less than the condition value, as an optimum measurement point setting.

11. The alignment support device for a probe device according to claim 9, wherein the output unit outputs the number of measurement points in the setting of measurement points determined by the optimum measurement point determination unit.

12. The alignment support device for a probe device according to claim 10, wherein the output unit outputs an interval between the measurement points in the setting of the measurement points determined by the optimum measurement point determination unit.

13. An alignment support method for a probe device which brings probes of a tester into contact with a plurality of chips formed on a wafer, the alignment support method comprising:

an actual measurement data acquisition step of acquiring actual measurement data showing an actual measurement position of each of all chips of the wafer;

a condition value inputting step of inputting a condition value related to a variation amount of a position at which each probe is in contact with each of the chips when the chips are brought into contact with the probes;

a measurement point setting step of setting, as measurement points, chips to which alignment is to be performed from among all the chips of the wafer;

a shot position setting step of setting, as a shot position, positions of the probes with respect to the wafer when each of the chips of the wafer is brought into contact with the probe at an ideal contact position, and corrects the set shot position based on the actual measurement position of chips to be the measurement points set by the measurement point setting step;

a variation amount calculation step of calculating the variation amount of the position of each of the chips of the wafer based on the actual measurement position of each of the chips when it is assumed that each of the chips of the wafer is brought into contact with the probe in accordance with the shot position after correction set by the shot position setting step;

a determination step of determining whether the variation amount of the position of each of the chips calculated by the variation amount calculation step is equal to or less than the condition value inputted by the condition value inputting step, or not;

a measurement point changing step of sequentially changing a setting of the measurement points by the measurement point setting step, to a different setting;

an optimum measurement point determination step of determining a setting of measurement points, in which the variation amount of each of the chips calculated by the variation amount calculation step is equal to or less than the condition value and a number of the measurement points is minimum, as an optimum measurement point setting, from among the settings of the measurement points sequentially changed by the measurement point changing step; and an outputting step of outputting information related to the optimum measurement point setting determined by the optimum measurement point determination step.

14. An alignment support method for a probe device which brings probes of a tester into contact with a plurality of chips formed on a wafer, the alignment support method comprising:

a condition value inputting step of inputting a condition value related to alignment time showing time required to alignment for measuring a position of each of chips of the wafer is finished;

a measurement point setting step of setting chips for which alignment is to be performed from among all the chips of the wafer, as measurement points;

an alignment time calculation step of calculating the alignment time required when it is assumed that alignment is performed for the chips set as the measurement points by the measurement point setting step;

a determination step of determining whether an alignment time calculated by the alignment time calculation step is equal to or less than the condition value inputted by the condition value inputting step;

a measurement point changing step of sequentially changing a setting of the measurement points set by the measurement point setting step, to a different setting;

an optimum measurement point determination step of determining a setting of measurement points, in which the alignment time calculated by the alignment time calculation step is equal to or less than the condition value, and a number of the measurement points is maximum, as an optimum measurement point setting, from among the settings of the measurement points sequentially changed by the measurement point changing step; and an outputting step of outputting information related to the optimum measurement point setting determined by the optimum measurement point determination step.

* * * * *